(12) United States Patent
Estes

(10) Patent No.: US 10,122,320 B2
(45) Date of Patent: Nov. 6, 2018

(54) SOLAR PANEL PERSONALITY ENGINE

(71) Applicant: SunCulture Solar, Inc., Mountain View, CA (US)

(72) Inventor: Christopher A. Estes, Mountain View, CA (US)

(*) Notice: Subject to any disclaimer, the term of this patent is extended or adjusted under 35 U.S.C. 154(b) by 0 days.

(21) Appl. No.: 15/271,400

(22) Filed: Sep. 21, 2016

(65) Prior Publication Data

US 2017/0012581 A1 Jan. 12, 2017

Related U.S. Application Data

(63) Continuation-in-part of application No. 15/260,477, filed on Sep. 9, 2016, which is a continuation of application No. 13/843,573, filed on Mar. 15, 2013, now Pat. No. 9,444,397.

(60) Provisional application No. 61/719,140, filed on Oct. 26, 2012.

(51) Int. Cl.
| | |
|---|---|
| *H02S 50/00* | (2014.01) |
| *H02S 20/32* | (2014.01) |
| *H02J 3/38* | (2006.01) |
| *H01L 31/02* | (2006.01) |
| *H02J 3/46* | (2006.01) |
| *H02J 9/06* | (2006.01) |
| *H02S 40/38* | (2014.01) |
| *H02S 40/30* | (2014.01) |
| *H02S 40/36* | (2014.01) |

(52) U.S. Cl.
CPC ........ *H02S 50/00* (2013.01); *H01L 31/02021* (2013.01); *H02J 3/383* (2013.01); *H02J 3/385* (2013.01); *H02J 3/46* (2013.01); *H02J 9/06* (2013.01); *H02S 20/32* (2014.12); *H02S 40/30* (2014.12); *H02S 40/36* (2014.12); *H02S 40/38* (2014.12); *Y02E 10/563* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,977,659 A | * | 11/1999 | Takehara | H02J 3/383 307/126 |
| 8,242,634 B2 | * | 8/2012 | Schatz | H02J 3/385 307/82 |
| 8,289,183 B1 | * | 10/2012 | Foss | H04Q 9/00 340/870.02 |

(Continued)

*Primary Examiner* — Kidest Bahta

(57) ABSTRACT

A solar panel is disclosed that detects conditions triggered by operational events and then selects behavioral actions for the solar panel to execute in response to the operational events. Condition detection devices detect conditions that the solar panel is exposed to where each condition is triggered by an operational event that the solar panel is encountering. The condition detection devices generate condition data that provides information as to each of the conditions that the solar panel is exposed to and each operational event that triggered each of the conditions that the solar panel is encountering. A personality engine analyzes the condition data provided by the condition detection devices to determine a behavioral action that the solar panel is to execute in response to each operational event that the solar panel is encountering and executes the determined behavioral action to respond to each operational event that the solar panel is encountering.

7 Claims, 11 Drawing Sheets

(56) References Cited

U.S. PATENT DOCUMENTS

| | | | | |
|---|---|---|---|---|
| 8,744,791 B1* | 6/2014 | Kraft | ................ | H02S 50/00 |
| | | | | 702/65 |
| 2002/0038667 A1* | 4/2002 | Kondo | ................ | H02J 3/383 |
| | | | | 136/244 |
| 2008/0283118 A1* | 11/2008 | Rotzoll | ................ | H02M 7/003 |
| | | | | 136/251 |
| 2012/0256490 A1* | 10/2012 | Zheng | ................ | H02J 3/383 |
| | | | | 307/52 |
| 2013/0192589 A1* | 8/2013 | Silberstein | ................ | F03G 6/06 |
| | | | | 126/714 |

* cited by examiner

SOLAR PANEL PERSONALITY ENGINE

CROSS-REFERENCE TO RELATED APPLICATIONS

The present application is a Continuation-in-Part (C-I-P) application of and claims the benefit of co-pending U.S. patent application Ser. No. 15/260,477 filed Sep. 9, 2016 which is a continuation application of U.S. Pat. No. 9,444,397 filed Mar. 15, 2013, which claims the benefit of U.S. patent application Ser. No. 61/719,140, filed Oct. 26, 2012.

BACKGROUND

Field of Disclosure

The present disclosure relates generally to solar power energy generation, delivery, allocation and communication devices and to related computer software.

Related Art

Conventional solar panel systems have evolved from dependency on the collective conversion of solar energy to direct current ("DC") power to reliance on other power sources when conditions limit the collection of solar energy required to adequately support the conventional systems. For example, conventional solar panel systems may now provide alternative current ("AC") power when conditions warrant from a connection to an electric utility grid. Conventional solar panel systems that are grid tied use the AC power provided by the utility grid to power when conditions limit the collection of solar energy. Thus, modern conventional solar panel systems are no longer exclusively dependent on the DC power collected from the conversion of solar energy to adequately sustain the power needed.

Conventional solar panel systems can also increase their output power by daisy chaining additional conventional solar panels together. Conventional daisy chaining of conventional solar panels increases the overall AC output power when connected to the grid and receiving the AC power from the grid. Conventional daisy chaining of conventional solar panels also increases the overall DC output power when the conventional system is isolated from the grid and not receiving the AC power from the grid. Each of the principal components of the conventional solar panel systems is a separate entity and not included within a single housing. For example, a conventional solar panel system for a house will include conventional solar panels located on the roof of the house while the conventional battery system is located in the basement of the house, and the conventional inverter is located on the side of the house.

Conventional solar panel systems are limited to generating AC output power when the conventional system is connected to the grid and receiving the AC power generated by the grid. Conventional solar panel systems cannot generate AC power when isolated from the grid or cut off from the AC power generated by the grid. Conventional solar panel systems are limited to generating DC output power when isolated from the grid or cut off from the AC power generated by the grid. The DC output power is limited to DC power stored in batteries or DC power converted from solar energy. Further, the DC output power is inaccessible DC power in that the DC output power cannot be accessed from the conventional solar panel systems. For example, the conventional solar panel systems fail to include an AC output power outlet in which the AC output can be accessed.

BRIEF DESCRIPTION OF THE DRAWINGS/FIGURES

Embodiments of the present disclosure are described with reference to the accompanying drawings. In the drawings, like reference numerals indicate identical or functionally similar elements. Additionally, the left most digit(s) of a reference number typically identifies the drawing in which the reference number first appears.

Figure 1:
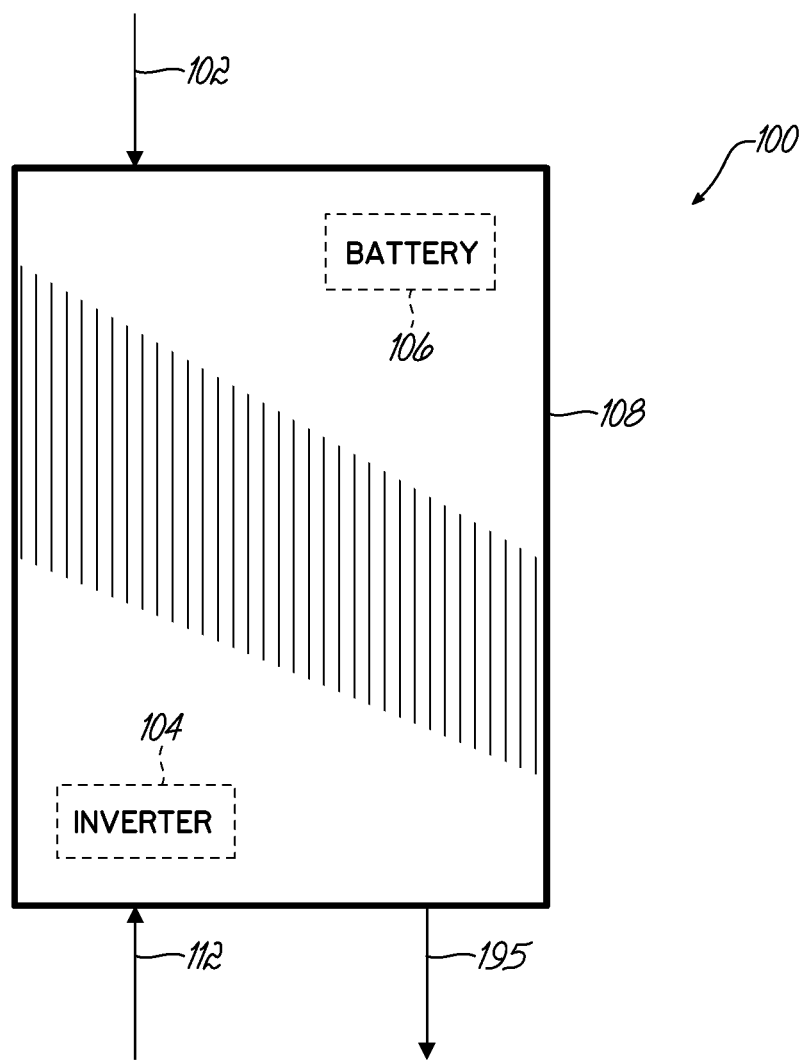
FIG. 1 is a top-elevational view of an exemplary solar panel according to an exemplary embodiment of the present disclosure.

The present disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE PRESENT DISCLOSURE

The following Detailed Description refers to accompanying drawings to illustrate exemplary embodiments consistent with the present disclosure. References in the Detailed Description to "one exemplary embodiment," "an exemplary embodiment," an "example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic may be described in connection with an exemplary embodiment, it is within the knowledge of those skilled in the art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the present disclosure. Therefore, the Detailed Description is not meant to limit the present disclosure. Rather, the scope of the present disclosure is defined only in accordance with the following claims and their equivalents.

Embodiments of the present disclosure may be implemented in hardware, firmware, software, or any combination thereof Embodiments of the present disclosure may also be implemented as instructions supplied by a machine-readable medium, which may be read and executed by one or more processors. A machine-readable medium may include any mechanism for storing or transmitting information in a form readable by a machine (e.g., a computing device). For example, a machine-readable medium may include read only memory ("ROM"), random access memory ("RAM"), magnetic disk storage media, optical storage media, flash memory devices, electrical optical, acoustical or other forms of propagated signals (e.g., carrier waves, infrared signals, digital signals, etc.), and others. Further firmware, software routines, and instructions may be described herein as performing certain actions. However, it should be appreciated that such descriptions are merely for convenience and that such actions in fact result from computing devices, processors, controllers, or other devices executing the firmware, software, routines, instructions, etc.

For purposes of this discussion, each of the various components discussed may be considered a module, and the term "module" shall be understood to include at least one of software, firmware, and hardware (such as one or more circuit, microchip, or device, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the spirit and scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

FIG. 1 illustrates a top-elevational view of an exemplary solar panel according to an exemplary embodiment of the present disclosure. The solar panel 100 is configured to collect energy 102 from a light source, such as the sun, and convert that energy with an inverter 104 into DC power and if desired, store that power in a battery 106 or other power storage device. A solar panel 100 may additionally be a standalone AC power generating device by converting or inverting the DC power to AC power. However, the solar panel 100 is not limited to generating output AC power 195 by passing through input AC power 112 received from a utility grid into the output AC power 195 when the solar panel 100 is coupled to the utility grid. Rather, the solar panel 100 may still generate standalone output AC power 195 when isolated from the utility grid, i.e., not grid tied.

The solar panel 100 may also receive input AC power 112 that is generated by an electric utility grid when the solar panel 100 is coupled to the grid, i.e, when it is grid tied. In such cases, the solar panel 100 may parallel the AC output power 195 generated from the inverted DC power provided by a DC battery 106 with the input AC power 112 when the output AC power 195 is synchronized with the input AC power 112. The input AC power 112 may also be generated by a second solar panel 100 when it is coupled to a first solar panel 100, by an AC power generator, an AC power inverter, a sinusoidal AC power inverter, and/or any other type of AC power source independent from the solar panel 100 that will be apparent to those skilled in the relevant art(s) without departing from the spirit and scope of the disclosure.

The solar panel 100 may generate the output AC power 195 that is in parallel with the input AC power 112 when the output AC power 195 is synchronized with the input AC power 112. The solar panel 100 may sense the input AC power 112 when the solar panel 100 is coupled to a power source. The solar panel 100 may also sense the input AC power 112 when the solar panel 100 is coupled to the second solar panel and the second solar panel is providing the input AC power 112 to the solar panel 100.

The solar panel 100 may determine whether the input AC power 112 is synchronized with the output AC power 195 based on the power signal characteristics of the input AC power 112 and the output AC power 195. The power signal characteristics are characteristics associated with the sinusoidal waveform included in the input AC power 112 and the output AC power 195. The solar panel 100 may generate the output AC power 195 that is in parallel with the input AC power 112 when the power signal characteristics of the input AC power 112 are within a threshold of the power signal characteristics of the output AC power 195 so that the input AC power 112 and the output AC power 195 are synchronized. The solar panel 100 may refrain from generating the output AC power 195 that is in parallel with the input AC power 112 when the power signal characteristics of the input AC power 112 are outside the threshold of the power signal characteristics of the output AC power 195 where the input AC power 112 and the output AC power 195 are not synchronized.

For example, the solar panel 100 determines whether the input AC power 112 and the output AC power 195 are synchronized based on the frequency and the voltage of the sinusoidal waveform included in the input AC power 112 and the frequency and the voltage of the sinusoidal waveform included in the output AC power 195. The solar panel 100 generates the output AC power 195 that is in parallel with the input AC power 112 when the frequency and the voltage of the input AC power 112 are within the threshold of 10% from the frequency and the voltage of the output AC power 195 so that the input AC power 112 and the output AC power 195 are synchronized. The solar panel 100 refrains from generating the output AC power 195 that is in parallel with the input AC power 112 when the frequency and the voltage of the input AC power 112 are outside the threshold of 10% from the frequency and the voltage of the output AC power 195 where the input AC power 112 and the output AC power 195 are not synchronized. Rather, the solar panel 100 generates the output AC power 195 that is generated from the DC source and refrains from combining the output AC power 195 with the input AC power 112.

The power signal characteristics may include but are not limited to frequency, phase, amplitude, current, voltage and/or any other characteristic of a power signal that will be apparent to those skilled in the relevant art(s) without departing from the spirit and scope of the disclosure. The solar panel 100 may store the power signal characteristics of the input AC power 112. The threshold of the power signal characteristics associated with the input power as compared to the output power may be any threshold that prevents damage from occurring to the power converter 100 by combining the input AC power 112 and the output AC power 195 when the power signal characteristics of each significantly differ resulting in damage that will be apparent to those skilled in the relevant art(s) without departing from the spirit and scope of the disclosure.

In short, the output AC power 195 generated by the solar panel 100 may be used to power electronic devices external to the solar panel 100, such as a hairdryer, for example. The output AC power 195 may also be provided to another solar panel. The solar panel 100 may also convert the input AC power 112 to DC power and store the DC power within the solar panel 100. The solar panel 100 may continue to provide standalone output AC power 195 even after it is no longer receiving AC input power 112. Thus the solar panel 100 is not reliant on external sources to generate output AC power 195. For example, the solar panel 100 may continue to provide standalone output AC power 195 after it is no longer grid tied, or after it is no longer receiving AC input power 112 from another solar panel. For example, the solar panel 100 continues to provide output AC power 195 that is not in parallel with the input AC power 112 after the power converter 100 is no longer coupled to a power source such that the solar panel 100 is no longer receiving the input AC power 112 from the power source. In another example, the solar panel 100 continues to provide output AC power 195 that is not in parallel with the input AC power 112 after the solar panel 100 is no longer receiving the input AC power 112 from the second solar panel.

The solar panel 100 will also sense when it is no longer receiving AC input power 112. The solar panel 100 may then internally generate the standalone output AC power 195 from the previously stored DC power. For example, the solar panel 100 may have previously stored DC power that was converted from the input AC power 112 or that was converted from the solar energy 102.

The solar panel 100 may internally generate the output AC power 195 by converting the previously stored DC power into the output AC power 195. In one embodiment, the solar panel 100 may synchronize the power signal characteristics of the output AC power 195 that was converted from the previously stored DC power to be within the threshold of the power signal characteristics of the input AC power 112 despite no longer receiving the input AC power 112. For example, the solar panel 100 synchronizes the output AC power 195 that was converted from the previously stored DC power to have frequency and voltage that is within a threshold of 10% from the input AC power 112 when the solar panel 100 was receiving the input AC power 112. The solar panel 100 then provides the output AC power 195 when the solar panel 100 is no longer receiving the input AC power 112 while providing such output AC power 195 with frequency and voltage that is within the threshold of 10% from the previously received input AC power 112.

The solar panel 100 may be scalable in size and may be able to provide various levels of output power. For example, the solar panel 100 may be a portable model that may output approximately 250 W. In another example, the solar panel 100 may be a permanent rooftop model that may output 2.5 kW.

The solar panel 100 is also efficient in that it includes all of the components required to generate output AC power 195 within a single housing 108. For example, as will be discussed in more detail below, a solar power collector, a battery bank, a DC to AC converter, a controller, and other necessary components required to generate output AC power 195 are located within a single housing. This minimizes the amount of cabling required for the solar panel 100 so that transmission loss is minimized.

The solar panel 100 is also user friendly in that an individual may find that operating it requires relatively minimal effort. For example, as will be discussed in more detail below, the individual simply plugs in an external electrical device into the outlet provided on the solar panel 100 to power the external electrical device. In another example, the individual simply plugs in an additional solar panel into the outlet provided on the solar panel 100 to daisy chain the additional solar panel together. In yet another example, the solar panel 100 that is daisy chained to additional solar panels automatically establishes a master slave relationship so that the individual is not required to manually designate which is the master and the slave.

Figure 2:
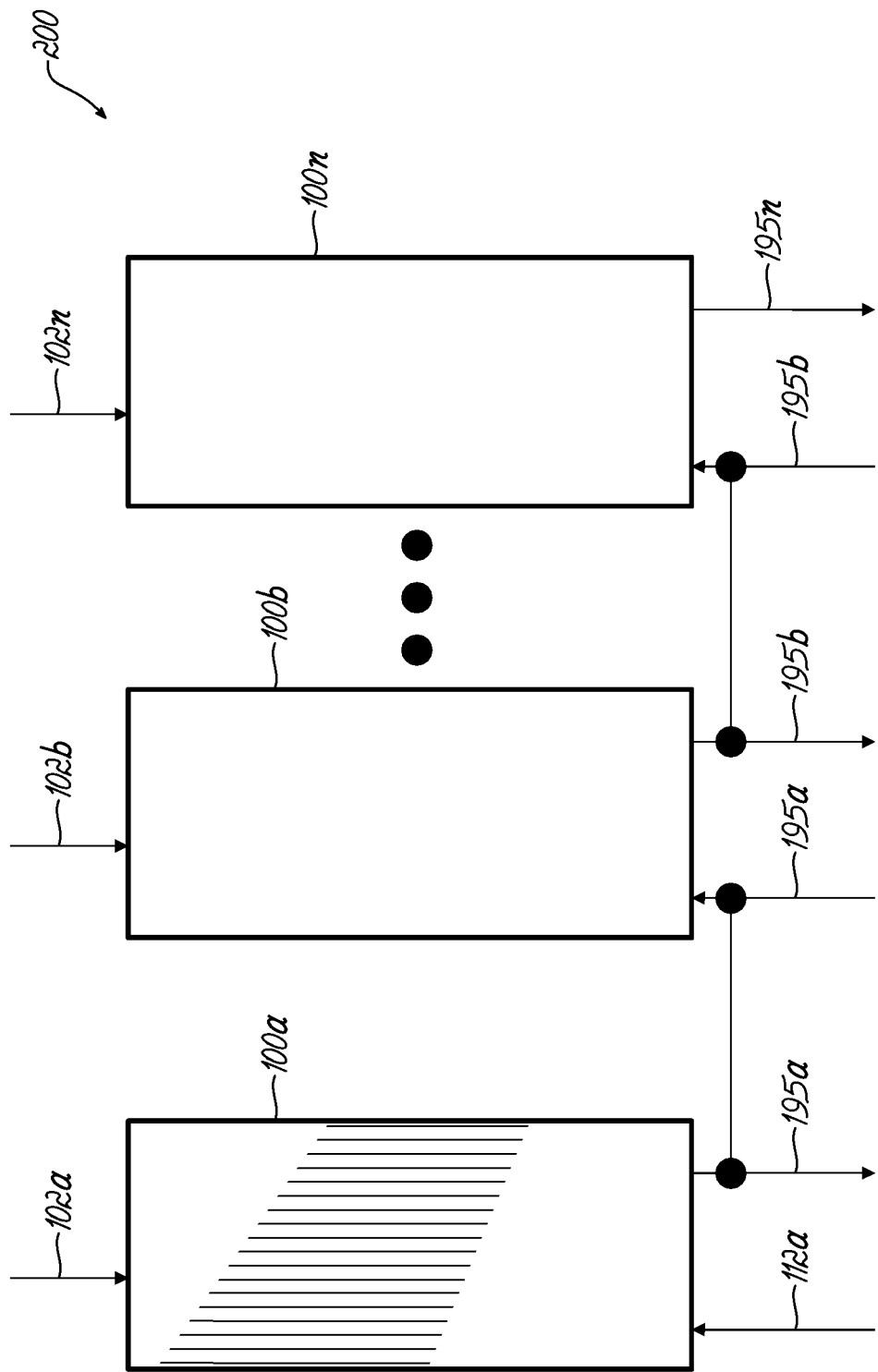
FIG. 2 is a top-elevational view of a solar panel configuration according to an exemplary embodiment of the present disclosure.

FIG. 2 illustrates a top-elevational view of a solar panel configuration according to an exemplary embodiment of the present disclosure. The solar panel configuration 200 represents a solar panel configuration that includes a plurality of solar panels 100*a* through 100*n* that may be daisy chained together to form the solar panel configuration 200, where n is an integer greater than or equal to two. Each solar panel 100*a* through 100*n* that is added to the solar panel configuration 200 may generate output AC power 195*n* that is in parallel with output AC power 195*a*, 195*b*. The solar panel configuration 200 shares many similar features with the solar panel 100 and as such, only the differences between the solar panel configuration 200 and the solar panel 100 will be discussed in further detail.

As noted above, the solar panel 100*a* generates output AC power 195*a*. However, the solar panel 100*a* is limited to a maximum output power level for the output AC power 195*a*. For example, the solar panel 100*a* may be limited to a maximum output power 195*a* level of 500 Watts ("W"). hence, regardless of the AC input power 112*a* level, the maximum output AC power 195*a* will be 500 W. Thus, if an individual desires, for example, to power a hair dryer that requires 1500 W to operate, the solar panel 100*a* will not be able to power it.

However, a user could daisy chain additional solar panels 100*b* through 100*n* together to parallel the output AC power 195*a* so that the overall output power of the solar panel configuration 200 is increased. In daisy chaining the plurality of solar panels 100*a* through 100*n*, each power input for each solar panel 100*b* through 100*n* is coupled to a power output of a solar panel 100*b* through 100*n* that is ahead of the solar panel 100*b* through 100*n* in the daisy chain configuration. For example, the power input of the solar panel 100*b* is coupled to the power output of the solar panel 100*a* so that the input AC power 195*a* received by the solar panel 100*b* is substantially equivalent to the output AC power 195*a* of the solar panel 100*a*. The power input of the solar panel 100*n* is coupled to the power output of the solar panel 100*b* so that the input AC power 195*b* received by the solar panel 100*n* is substantially equivalent to the output AC power 195*b* of the solar panel 100*b*.

After daisy chaining each of the plurality of solar panels 100(*a-n*), each output AC power 195(*a-n*) may be paralleled with each input AC power 112*a*, 112*b*, and/or 112*n* to increase the overall output AC power of the solar panel configuration 200. Each output AC power 195(*a-n*) may be paralleled with each input AC power 112*a*, 112*b*, and 112*n* so that the overall output AC power of the solar panel configuration 200 may be used to power the external electronic device that the individual requests to operate, such as the hair dryer. The individual may access the overall output AC power by coupling the external electronic device that the individual requests to power, such as the hair dryer, into any of the solar panels 100(*a-n*). The individual is not limited to coupling the external electronic device into the final solar panel 100*n* in the solar panel configuration 200 in order to access the overall output AC power. Rather, the individual may access the overall output AC power by coupling the external electronic device to any of the solar panels 100(*a-n*) in the solar panel configuration 200.

For example, if the maximum output AC power 195*a* for the solar panel 100*a* is 500 W, the maximum output power that can be generated by the solar panel 100*b* is also 500 W. The maximum output power that can be generated by the solar panel 100*n* is also 500 W. However, the solar panel 100*b* is daisy chained to the solar panel 100*a* and the solar panel 100*b* is daisy chained to the solar panel 100*n*. As a result, the external input AC power 112*a*, 112*b*, and 112*n* for each of the solar panels 100(*a-n*) is in parallel with the output AC power 195*a*, 195*b*, and 195*n* for each of the solar panels 100(*a-n*).

The output AC power 195*a*, 195*b*, and 195*n* for each of the solar panels 100(*a-n*) is 500 W. The solar panel 100*b* generates the output AC power 195*b* of 500 W in parallel with the input AC power 112*b* of 500 W so that the output AC power 195*b* and/or the output AC power 195*a* is the paralleled AC output power of 1000 W when the solar panel 100*b* is daisy chained to the solar panel 100*a*. The solar panel 100*n* is then daisy chained to the solar panels 100*a* and 100*b* so that the output AC power 195*a*, the output AC power 195*b* and/or the output AC power 195*n* is the paralleled AC output power of 1500 W. Thus, the maximum output AC power for the solar panel configuration 200 is 1500 W. The maximum output AC power of 1500 W is now sufficient to power the hair dryer that requires 1500 W to operate.

The individual may plug the hair dryer into any of the solar panels 100(*a-n*) in order to access the maximum output AC power of 1500 W generated by the solar panel configuration 200 to power the hair dryer. The individual is not limited to plugging the hair dryer into the solar panel 100*n* simply because the solar panel 100*n* is the last solar panel in the daisy chain of the solar panel configuration 200. The daisy chaining of each of the plurality of solar panels 100(*a-n*) when the plurality of solar panels 100(*a-n*) are not coupled to a power source but generating paralleled output AC power may be considered a standalone solar panel micro grid.

Each of the solar panels 100*a* through 100*n* included in the solar panel configuration 200 may operate in a master/slave relationship with each other. The master is the originator of the standalone AC power for the solar panel configuration 200. The master determines the power signal characteristics of the standalone AC power originated by the master in that each of the remaining slaves included in the solar panel configuration 200 are required to accordingly synchronize each of their own respective AC output powers. Each respective AC power output that is synchronized to the master standalone AC is paralleled with the master standalone AC power for the master. For example, the utility grid is the master of the solar panel configuration 200 when the utility grid is the originator of the input AC power 112*a* provided to solar panel 100*a*. The utility grid determines the frequency, phase, amplitude, voltage and current for the input AC power 112*a*. Each solar panel 100*a* through 100*n* then become a slave and synchronizes each of their respective output AC power 195*a* through 195*n* to have substantially equivalent frequency, phase, amplitude, and current as the input AC power 112*a*. Each output AC power 195*a* through 195*n* that is synchronized with input AC power 112*a* is paralleled with the input AC power 112*a*.

Each of the solar panels 100*a* through 100*n* operates as a slave for the solar panel configuration 200 when each of the solar panels 100*a* through 100*n* is receiving input AC power. Each of the solar panels 100*a* through 100*n* operates as a master when each of the solar panels 100*a* through 100*n* no longer receives input AC power. For example, each of the solar panels 100*a* through 100*n* operate as the slave when the solar panel configuration 200 is grid tied so that the utility grid operates as the master for the solar panel configuration 200. Each solar panel 100*a* through 100*n* receives input AC power from either the grid or its adjacent panel. Solar panel 100*a* is receiving the input AC power 112*a* from the grid making solar panel 100*a* the slave while solar panel 100*b* receives the input AC power 195*a* from solar panel 100*a* making solar panel 100*b* the slave, etc.

In another example, solar panel 100*a* operates as the master for the solar panel configuration 200 when the solar panel configuration 200 is no longer grid tied and solar panel 100*a* is generating standalone output AC power 195*a*. Each of the solar panels 100*b* through 100*n* then receives input AC power via the standalone output AC power 195*a* internally generated by the master solar panel 100*a*. Solar panel 100*b* receives input AC power 195*a* from solar panel 100*a* and solar panel 100*c* receives the input AC power 195*b* from the solar panel 100*b*.

The solar panel configuration 200 may automatically transition the master/slave designations between each of the solar panels 100*a* through 100*n* without user intervention. As noted above, any solar panel 100*a* through 100*n* may be designated as the master of the solar panel configuration 200 when it no longer receives input AC power. And the master solar panel will automatically transition to a slave when it senses input AC power coming into it. At that point, the master solar panel automatically terminates its internal standalone output AC power generation from its own previously stored DC power That solar panel then automatically synchronizes to the power signal characteristics of the input AC power it now receives to parallel the output AC power provided by the new master solar panel and begin operating as a slave by generating output AC power it now receives.

For example, when solar panel 100*b* operates as a master, the solar panel 100*b* is not receiving input AC power but rather is internally generating its own standalone output AC power 195*b* from its own previously stored DC power. The solar panel 100*b* continues to operate as the master until the solar panel 100*b* senses that input AC power 195*a* is being received by it from the solar panel 100*a*, which is generating the input AC power 195*a*. The solar panel 100*b* then automatically terminates internally generating its own standalone output AC power 195*b* from its own previously stored DC power, and automatically synchronizes the standalone output AC power 195*b* to the frequency, phase, amplitude, and current of the input AC power 195*a*. In other words the solar panel 100*b* transitions to being a slave when the solar panel 100*b* generates the output AC power 195*b* from the input AC power 195*a* rather than from its own previously stored DC power.

The solar panel configuration 200 may also automatically transition the slave solar panels 100*a* through 100*n* to being a master without user intervention. As noted above, solar panels 100*a* through 100*n* may be designated as slaves when they are receiving input AC power. However, they may automatically transition to being a master when they no longer sense input AC power coming into them. At that point, they automatically begin internally generating their own standalone output AC power from their own previously stored DC power. The solar panels 100*a* through 100*n* may also have stored the power signal characteristics of the input power previously received by them and may automatically synchronize their own standalone output AC power to these characteristics. Again the solar panels 100*a* through 100*b* transitions from a slave to a master when they begin to internally generate their own standalone output AC power from their own previously stored DC power.

After the master-slave relationship is established between each of the master solar panels 100(*a-n*), the paralleled output AC power of the master solar panel configuration 200 may be maintained by the solar panel converter 100*a* and each of the slave solar panels 100(*b-n*). The master solar panel 100*a* may maintain the voltage of the paralleled output AC power while the slave solar panels 100(*b-n*) provide the current to maintain the voltage of the paralleled output AC power at a reference voltage.

However, the voltage of the paralleled output AC power may decrease when the external electronic device the individual requests to power, such as the hair dryer, is coupled to at least one of the outputs for the solar panels 100(*a-n*). Each of the slave solar panels 100(*b-n*) may increase the current of the paralleled output AC power so that the voltage of the paralleled output AC power maintained by the master solar panel 100*a* is increased back to the reference voltage sufficient to generate the paralleled output AC power. The reference voltage of the paralleled output AC power is the voltage level that is to be maintained to generate the paralleled output AC power that is sufficient to power the external electronic device. The reference voltage may be specified to be any voltage that is sufficient to maintain the paralleled output AC power that will be apparent to those skilled in the relevant art(s) without departing from the spirit and scope of the disclosure.

Each of the slave solar panels 100(*b-n*) may continue to generate current sufficient to maintain the voltage of the paralleled output AC power at the reference voltage so that the external electronic device is powered by the paralleled output AC power. However, eventually each of the slave solar panels 100(*b-n*) may have their DC sources depleted to the point where each of the slave solar panels 100(*b-n*) no longer has current that is sufficient to maintain the voltage of the paralleled output AC power at the reference voltage sufficient to generate the paralleled output AC power. At that point, the master solar panel 100*a* may begin to provide current to maintain the voltage of the paralleled output AC power at the reference voltage sufficient to generate the paralleled output AC power.

The solar panel configuration 200 may continue to generate output AC power even when a particular slave solar panel 100*a* through 100*n* may no longer be functional. In such cases, the dysfunctional slave solar panel 100*a* through 100*n* continues to pass through the standalone output AC power generated by the master solar panel 100*a* through 100*n* to each of the other slave solar panels 100*a* through 100*n*. For example, when the master solar panel 100*a* acts as the master and the solar panels 100*b* and 100*n* act as the slaves, if the slave solar panel 100*b* fails and is no longer functional, it will continue to pass through the output standalone AC power 195*a* generated by the master solar panel 100*a* to the functional slave solar panel 100*n* so that the other functional slave solar panel 100*n* may continue to generate output AC power 195*n* from the standalone output AC power 195*a*.

Figure 3:
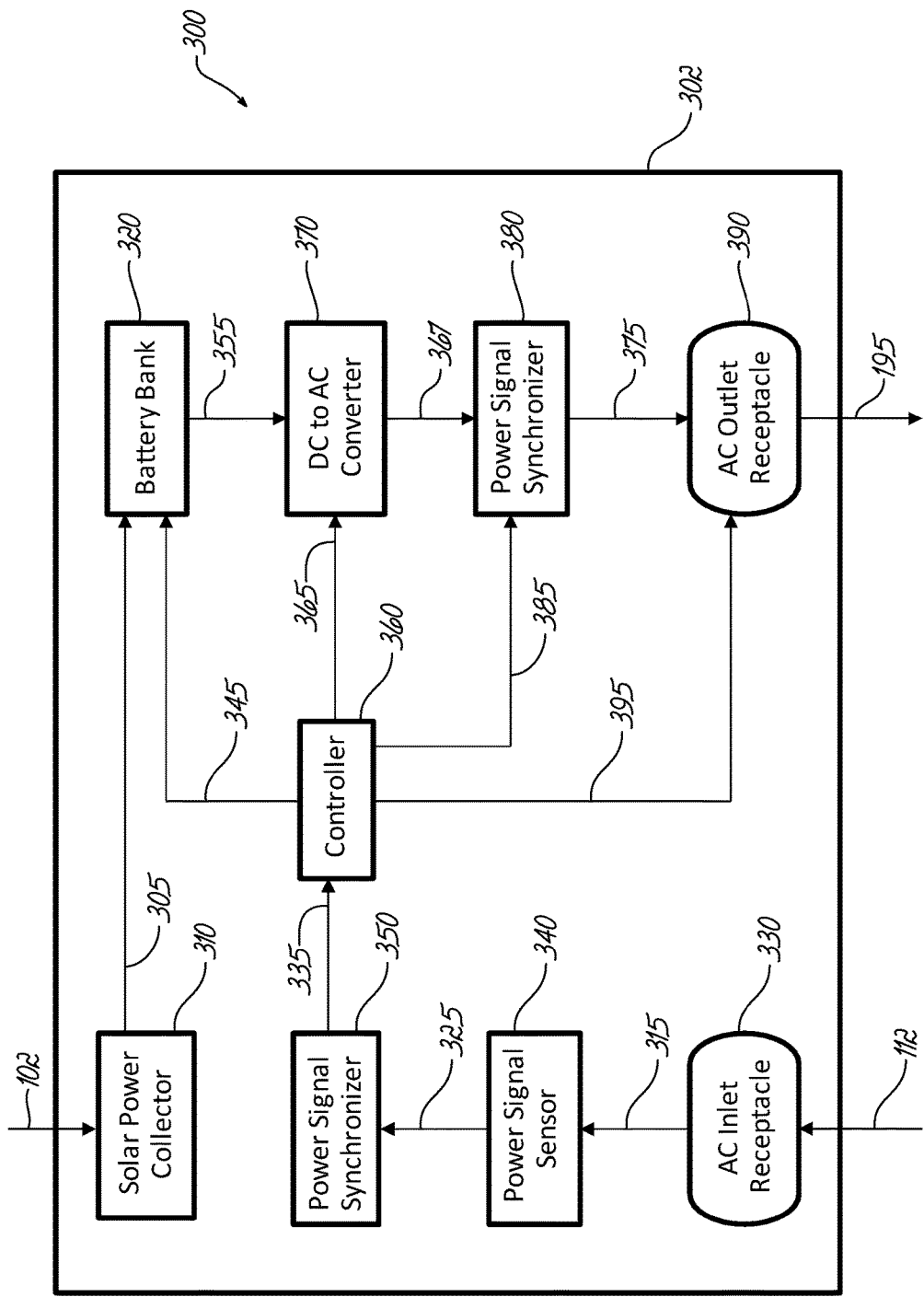
FIG. 3 is a block diagram of an exemplary solar panel that may be used in the solar panel configuration according to an exemplary embodiment of the present disclosure.

FIG. 3 is a block diagram of another exemplary solar panel 300 that may be used in the solar panel configuration 200 according to an exemplary embodiment of the present disclosure. Although FIG. 3 depicts a block diagram of the solar panel 300, FIG. 3 may also depict a block diagram of one of the plurality of solar panels 100*a* through 100*n* used in the solar panel configuration 200 depicted in FIG. 2 as well as the single solar panel 100 depicted in FIG. 1 Solar panel 300 will also automatically transition to internally generating standalone output AC power 195 based on the stored DC power 355 provided by the battery bank 320 when the power signal sensor 340 no longer senses the received input AC power 315. The solar panel 300 will also automatically transition to operating as a master when the power signal sensor 340 no longer senses the received input AC power 315. Solar panel 300 will also automatically transition to operating as a slave when the power signal sensor 340 begins to sense the received input AC power 315.

Enclosed within a single housing 302 for solar panel 300 is a solar power collector 310, a battery bank 320, an AC inlet receptacle 330, a power signal sensor 340, a power signal synchronizer 350, a controller 360, a DC to AC converter 370, a power signal synchronizer 380, and an AC outlet receptacle 390.

The solar panel collector 310 captures the solar or other light energy 102 from a solar or light source, e.g., the sun. The solar panel collector 310 may include a single and/or multiple photovoltaic ("PV") solar panels or arrays that convert the solar energy 102 into the captured DC power 305. The solar panel collector 310 captures solar energy 102 when the solar source is available and is radiating solar energy 102 in a sufficient manner for the solar panel collector 310 to capture. The solar panel collector 310 converts the solar energy 102 into DC captured power 305 in a wide range of voltages and/or current capacities. The solar panel collector 310 may include photovoltaic solar panels categorized as, but not limited to, mono-crystalline silicon, poly-crystalline silicon, amorphous silicon, cadmium telluride, copper indium selenide, thin-film layers, organic dyes, organic polymers, nanocrystals and/or any other type of photovoltaic solar panels that will be apparent to those skilled in the relevant art(s) without departing from the spirit and scope of the disclosure. The solar panel collector 310 may also be any shape or size that is sufficient to capture the solar energy 102 that will be apparent to those skilled in the relevant art(s) without departing from the spirit and scope of the disclosure.

The battery bank 320 receives and stores the captured DC power 305. The battery bank 320 accumulates the captured DC power 305 as the captured DC power 305 is generated. The battery bank 320 may accumulate the captured DC power 305 until the battery bank 320 is at capacity and can no longer store any more of the captured DC power 305. The battery bank 320 may also store the AC input power 112 that is converted to the captured DC power 305 when the AC output receptacle 390 is not generating the output AC power 195. The battery bank 320 stores the captured DC power 305 until requested to provide the stored DC power 355. The stored DC power 355 provided by the battery bank 320 may include low-voltage but high energy DC power. The battery bank 320 may include one or more lithium ion phosphate (LiFePO$_4$) and/or one or more lead acid cells. However, this example is not limiting, those skilled in the relevant art(s) may implement the battery bank 320 using other battery chemistries without departing from the scope and spirit of the present disclosure. One or more cells of the battery bank 320 convert chemical energy into electrical energy via an electromechanical reaction.

As noted above, the solar panel 300 may automatically transition between the master and/or slave designations without user intervention. The solar panel 300 will operate as a slave when the AC inlet receptacle 330 is receiving AC input power 112, such as AC power that is generated by the grid. The AC inlet receptacle 330 may also receive input AC power 112 when the AC inlet receptacle 330 is grid tied, such as AC power generated by a second solar panel when two panels are coupled together. The input AC power 112 may also be AC power generated by an AC power generator, an AC power inverter, or any other type of AC power source independent from the solar panel 300 that will be apparent to those skilled in the relevant art(s) without departing from the spirit and scope of the disclosure.

The AC inlet receptacle 330 may be in the form of a male configuration or a female configuration. A male AC inlet receptacle 330 prevents an individual from mistakenly plugging an electronic device into it with the intent to power the electronic device, as electronic devices typically have male plugs. The AC inlet receptacle 330 may also be fuse protected. The AC inlet receptacle 330 may also be configured to receive the input AC power 112 in American, European, and/or any other power format that will be apparent to those skilled in the relevant art(s) without departing from the spirit and scope of the disclosure. The AC inlet receptacle 330 may further include an Edison plug, any of the several International Electrotechnical Commission ("IEC") plugs, or any other type of plug that will be apparent to those skilled in the relevant art(s) without departing from the spirit and scope of the disclosure.

The AC inlet receptacle 330 provides received input AC power 315 to a power signal sensor 340. The power signal sensor 340 senses whether the solar panel 300 is receiving input AC power 112 through the AC inlet receptacle 330 based on whether it receives input AC power 315 from the AC inlet receptacle 330. Once the power signal sensor 340 senses the received input AC power 315, the power signal sensor 340 generates an incoming AC power signal 325. The incoming AC power signal 325 provides information regarding power signal characteristics of the input AC power 112 that the solar panel 300 is receiving through the AC inlet receptacle 330. These power signal characteristics may include, but are not limited to, frequency, phase, amplitude, current, voltage, and other like characteristics of power signals that will be apparent to those skilled in the relevant art(s) without departing from the spirit and scope of the disclosure.

The power signal sensor 340 provides the incoming AC power signal 325 to a power signal synchronizer 350. The power signal synchronizer 350 determines the power signal characteristics of the input AC power 112 that are provided by the incoming AC power signal 325. For example, the power signal synchronizer 350 determines the frequency, phase, amplitude, voltage, and current of the input AC power 112. The power signal synchronizer 350 generates a synchronized input power signal 335 that provides the power signal characteristics of the input AC power 112 to a controller 360.

The power signal synchronizer 350 also synchronizes the converted AC power 367 that is generated by the DC to AC converter 370 with the power signal characteristics of the input AC power 112. The power signal synchronizer 350 determines whether the power signal characteristics of the input AC power 112 are within the threshold of the power signal characteristics of the converted AC power 367. The power signal synchronizer 350 synchronizes the input AC power 112 with the converted AC power 367 when the power signal characteristics of the input AC power 112 are within the threshold of the power signal characteristics of the converted AC power 367. The power signal synchronizer 350 refrains from synchronizing the input AC power 112 with the converted AC power 367 when the power signal characteristics of input AC power 112 are outside the threshold of the power signal characteristics of the converted AC power 367.

For example, the power signal synchronizer 350 determines whether the frequency and the voltage of the sinusoidal waveform included in the input AC power 112 are within a threshold of 10% from the frequency and the voltage of the sinusoidal waveform included in the converted AC power 367. The power signal synchronizer 350 synchronizes the input AC power 112 with the converted AC power 367 when the frequency and the voltage of the input AC power 112 are within the threshold of 10% from the frequency and the voltage of the converted AC power 367. The power signal synchronizer 350 refrains from synchronizing the input AC power 112 with the converted AC power 367 when the frequency and the voltage of the input AC power 112 are outside the threshold of 10% from the frequency and the voltage of the converted AC power 367.

The output AC power 195 includes the input AC power 112 in parallel with the converted AC power 367 when the converted AC power 367 is synchronized with the input AC power 112. For example, the power signal synchronizer 350 synchronizes the converted AC power 367 to operate at within the threshold of 10% from the frequency and voltage of the input AC power 112. In one embodiment, the input AC power 112 embodies a substantially pure sinusoidal waveform. The substantially pure sinusoidal waveform may represent an analog audio waveform which is substantially smooth and curved rather than a digital audio waveform that includes squared off edges. In such an embodiment, the power signal synchronizer 350 synchronizes the converted AC power 367 to be within a threshold of the pure sinusoidal waveform embodied by the input AC power 112. After the power signal synchronizer 350 synchronizes the converted AC power 367 to the power signal characteristics of the input AC power 112, the power signal synchronizer 350 notifies the controller 360 of the synchronization via the synchronized input power signal 335.

The controller 360 receives the synchronized input power signal 335. The controller 360 determines the power signal characteristics of the input AC power 112 and then stores the power signal characteristics in a memory included in the controller 360. For example, the controller 360 stores the frequency, phase, amplitude, voltage, and/or current of the input AC power 112. After receiving the synchronized input power signal 335, the controller 360 is aware that the input AC power 112 is coupled to the AC inlet receptacle 330. In response to the input AC power 112 coupled to the AC inlet receptacle 330, the controller 360 stops generating a reference clock for the solar panel 300.

Also, in response to the input AC power 112 coupled to the AC inlet receptacle 330, the controller 360 also generates a battery bank signal 345. The controller 360 instructs the battery bank 320 via the battery bank signal 345 to no longer provide stored DC power 355 to the DC to AC inverter 370. The instruction by the controller 360 to the battery bank 320 to no longer provide stored DC power 355 to the DC to AC inverter 370 also terminates the standalone output AC power 195 that is generated from the stored DC power 355.

Further, in response to the input AC power 112 coupled to the AC inlet receptacle 330, the controller 360 confirms that the power signal synchronizer 350 has synchronized the converted AC power 367 to the power signal characteristics of the input AC power 112. After confirming that the power signal synchronizer 350 has synchronized the converted AC power 367 to the power signal characteristics of the input AC power 112, the controller 360 links in parallel the input AC power 112 being received by the AC inlet receptacle 330 with the converted AC power 367 to the AC outlet receptacle 390 to generate parallel AC power195. The AC outlet receptacle 390 then outputs the output AC power 195 that includes the input AC power 112 in parallel with the converted AC power 367 with power signal characteristics that are substantially equivalent to the power signal characteristics of the input AC power 112. For example, the frequency, phase, amplitude, voltage, and/or current of the output AC power 195 may be substantially equivalent to the frequency, phase, amplitude, voltage, and/or current of the input AC power 112.

The AC outlet receptacle 390 may be in the form of a male or a female configuration. A female AC outlet receptacle 390 allows an individual to directly plug an electronic device into it as electronic devices typically have male plugs.

The AC outlet receptacle 390 may also be fuse protected. The AC outlet receptacle 390 may be configured to provide the output AC power 195 in American, European, or any other power format that will be apparent to those skilled in the relevant art(s) without departing from the spirit and scope of the disclosure. The AC outlet receptacle 390 may also include an Edison plug, any of the IEC plugs, or any other type of plug that will be apparent to those skilled in the relevant art(s) without departing from the spirit and scope of the disclosure.

As noted above, the solar panel 300 will automatically transition between the master and/or slave designations without user intervention. The solar panel 300 will automatically transition from operating as a slave to operating as a master when the AC input power signal 112 diminishes and is no longer received by the AC inlet receptacle 330 such that the controller 360 no longer receives the synchronized input power signal 335. At that point, the controller 360 generates the battery bank signal 345 to instruct the battery bank 320 to begin generating stored DC power 355. The controller 360 generates a power conversion signal 365 to instruct the DC to AC converter 370 to convert the stored DC power 355 to converted AC power 367. The converted AC power 367 is high-voltage AC output power. The DC to AC converter 370 may use high frequency modulation in converting the stored DC power 355 to the converted AC power 367.

The controller 360 then provides a synchronized output power signal 385 to the power signal synchronizer 380. The synchronized output power signal 385 provides the power signal characteristics of the input AC power 112 when the input power signal 112 is coupled to the AC inlet receptacle 330 to the power signal synchronizer 380. For example, the synchronized output power signal 385 provides the frequency, phase, amplitude, voltage, and current of the input power signal 112 to the power signal synchronizer 380. The synchronized output power signal 385 also provides the reference clock to the power signal synchronizer 380.

The power signal synchronizer 380 then generates synchronized output AC power 375 by synchronizing the converted AC power 367 to the power signal characteristics of the input AC power 112 and the reference clock provided by the synchronized output power signal 385. In one embodiment, the input AC power 112 embodies a substantially pure sinusoidal waveform. In such an embodiment, the power signal synchronizer 380 synchronizes the converted AC power 367 to be within the threshold of the pure sinusoidal waveform embodied by the input AC power 112. The synchronized output AC power 375 includes power signal characteristics that are within the threshold of the power signal characteristics of the input AC power 112. For example, the synchronized output AC power 375 includes a frequency and voltage that is within the threshold of the frequency and voltage of the input AC power 112. The AC outlet receptacle 390 then generates the output AC power 195 based on the synchronized output power 375. Thus, the power converter 300 generates the output AC power 195 that is substantially similar to the input AC power 112 despite not receiving the input AC power 112 from other sources.

Figure 4A:
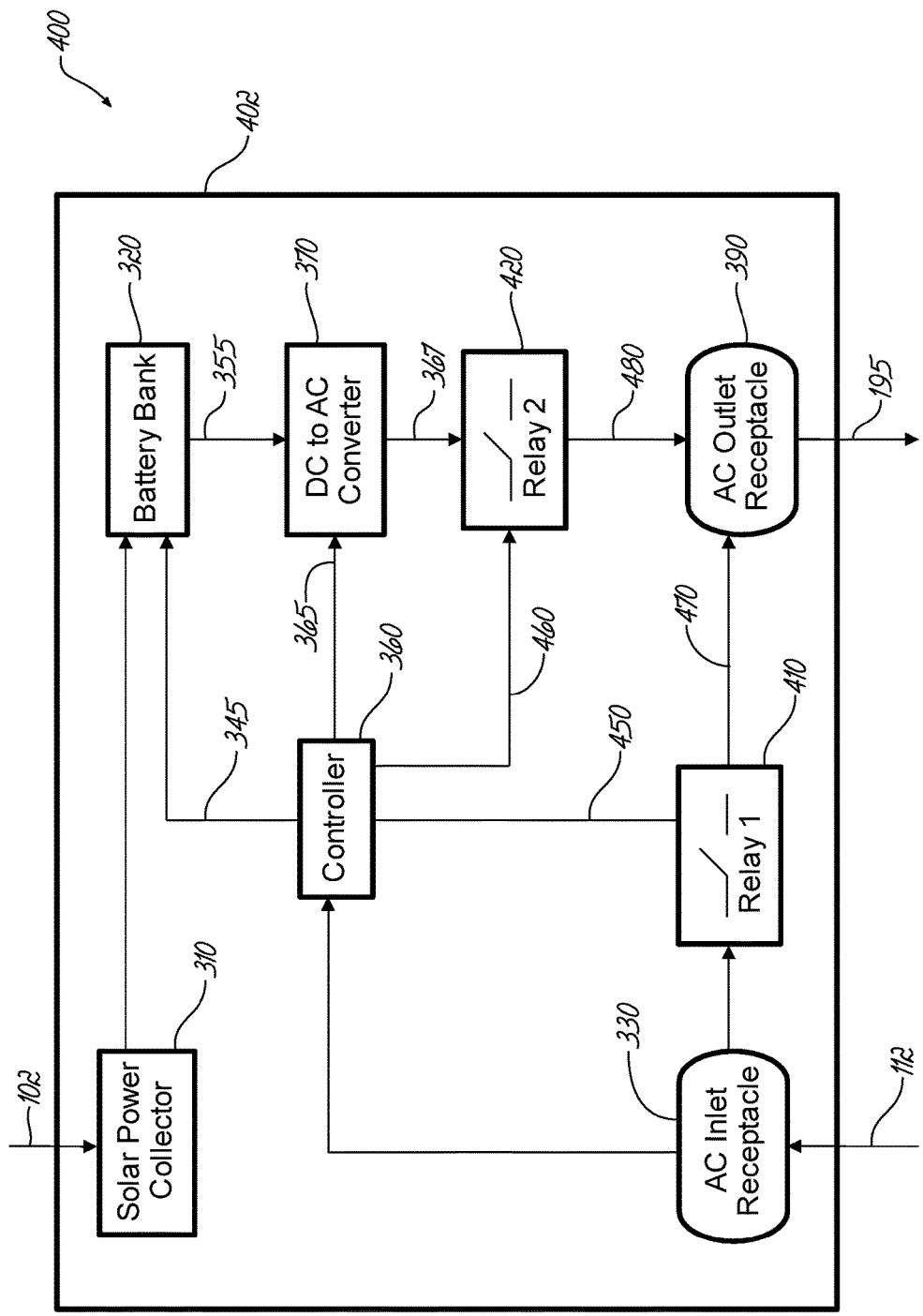
FIG. 4A is a block diagram of an exemplary solar panel that may be used in the solar panel configuration according to an exemplary embodiment of the present disclosure.

FIG. 4A is a block diagram of another exemplary solar panel 400 that may be used in the solar panel configuration 200 according to an exemplary embodiment of the present disclosure. Although, FIG. 4A depicts a block diagram of the solar panel 400, FIG. 4A may also depict a block diagram of one of the plurality of panels 100a through 100n used in the solar panel configuration 200 depicted in FIG. 2 and also the single solar panel 100 depicted in FIG. 1. The features depicted in the block diagram of the solar panel 300 may also be included in the solar panel 400 but have been omitted for simplicity.

The solar panel 400 may automatically transition from operating as a master and operating as a slave without user intervention based on a relay configuration. The solar panel 400 may be implemented using the solar power collector 310, the battery bank 320, the AC inlet receptacle 330, the controller 360, the DC to AC converter 370, the AC outlet receptacle 390, a first relay 410 and a second relay 420 each of which is enclosed within a housing 402 for the solar panel 400.

As noted above, the solar panel 400 operates as a slave when the controller 360 senses that the input AC power 112 is coupled to the AC inlet receptacle 330. The controller then terminates the generation of the standalone output AC power 195. The solar panel 400 operates as a master when the controller 360 no longer senses that the input AC power 112 is coupled to the AC inlet receptacle 330. The controller 360 then instructs the battery bank 320 and the DC to AC inverter 370 to begin generating the standalone output AC power 195. The relay configuration that includes a first relay 410 and a second relay 420 transitions the solar panel 400 between the master and slave modes based on the logic provided in Table 1.

TABLE 1

| | | |
|---|---|---|
| Master Mode | Relay 1 Open | Relay 2 Closed |
| Slave Mode | Relay 1 Closed | Relay 2 Closed |
| Unit Power Off (Bypassed) | Relay 1 Closed | Relay 2 Open |

When automatically transitioning from the slave mode to the master mode, the controller 360 no longer senses the input AC power 112 coupled to the AC inlet receptacle 330. At this point, the controller 360 generates a first relay signal 450 that instructs the first relay 410 transition to the open state (logic 0). The controller 360 also generates a second relay signal 460 that instructs the second relay 420 to transition to the closed state (logic 1). The controller 360 also generates battery bank signal 345 that instructs the battery bank 320 to begin providing the stored DC power 355 to the DC to AC converter 370 to generate the converted AC power 367. Because the second relay 420 is in the closed position (logic 1), the converted AC power 367 passes through the second relay 420, and as shown by arrow 480, onto the AC outlet receptacle 390 so that the solar panel 400 provides the AC output power 195 generated from the stored DC power 355 rather than the input AC power 112. The open state (logic 0) of the first relay 410 prevents any remaining input AC power 112 from reaching the AC output receptacle 390 when the solar panel 400 is generating the standalone AC output power 195 as operating as the master.

Once the controller 360 senses the input AC power 112 coupled to the AC inlet receptacle 330, the controller 360 automatically generates the power conversion signal 365 to instruct the DC to AC converter 370 to no longer provide converted AC power 367 so that the solar panel 400 no longer generates the standalone AC output power 195. The controller 360 also automatically generates the second relay signal 460 to instruct the second relay 420 to transition to the open state (logic 0). The controller 360 also generates the first relay signal 450 to instruct the first relay 410 to transition to the closed state (logic 1). After the second relay 420 transitions to the open state (logic 0) and the first relay 410 transitions to the closed state (logic 1), any input AC power 112 coupled to the AC inlet receptacle 330 passes through the first relay 410, and as shown by arrow 470, onto the AC outlet receptacle 390 so that the solar panel 400 generates the output AC power 195.

The second relay 420 remains in the open state (logic 0), until the controller 360 has successfully synchronized the solar panel 400 to the input AC power 112 coupled to the AC inlet receptacle 330. After the controller 360 properly synchronizes solar panel 400 to the input AC power 112 the controller 360 then generates the second relay signal 460 to instruct the second relay 420 to transition from the open state (logic 0) to the closed state (logic 1). After the second relay 420 transitions from the open state (logic 0) to the closed state (logic 1), the solar panel 400 will generate output AC power 195 that includes the converted AC power 367 that is in parallel to the input AC power 112.

The solar panel 400 also operates in a bypass mode. In the bypass mode, the solar panel 400 is powered off and is no longer functioning. In embodiment, the controller 360 generates the first relay signal 450 and instructs the first relay 410 to transition into the closed state (logic 1). The controller 360 also generates the second relay signal 460 and instructs the second relay 420 to transition into the open state (logic 0). In another embodiment, the first relay 410 and the second relay 420 are spring loaded relay switches. When the solar panel 400 powers off, the electromagnetic coil of the first relay 410 is no longer energized so the spring pulls the contacts in the first relay 410 into the up position. The closing of the first relay 410 and the opening of the second relay 420 cause the solar panel 400 to be a pass through where the input AC power 112 passes through the solar panel 400 and onto a second solar panel daisy chained to the solar panel 400 and/or to an electronic device being powered by the input AC power 112. Thus, additional solar panels and/or electronic devices down the line from the dysfunctional solar panel 400 continue to operate off of the input AC power 112. The first relay 410 and the second relay 420 may be implemented in hardware, firmware, software, or any combination thereof that will be apparent to those skilled in the relevant art(s) without departing from the spirit and scope of the disclosure.

Figure 4B:
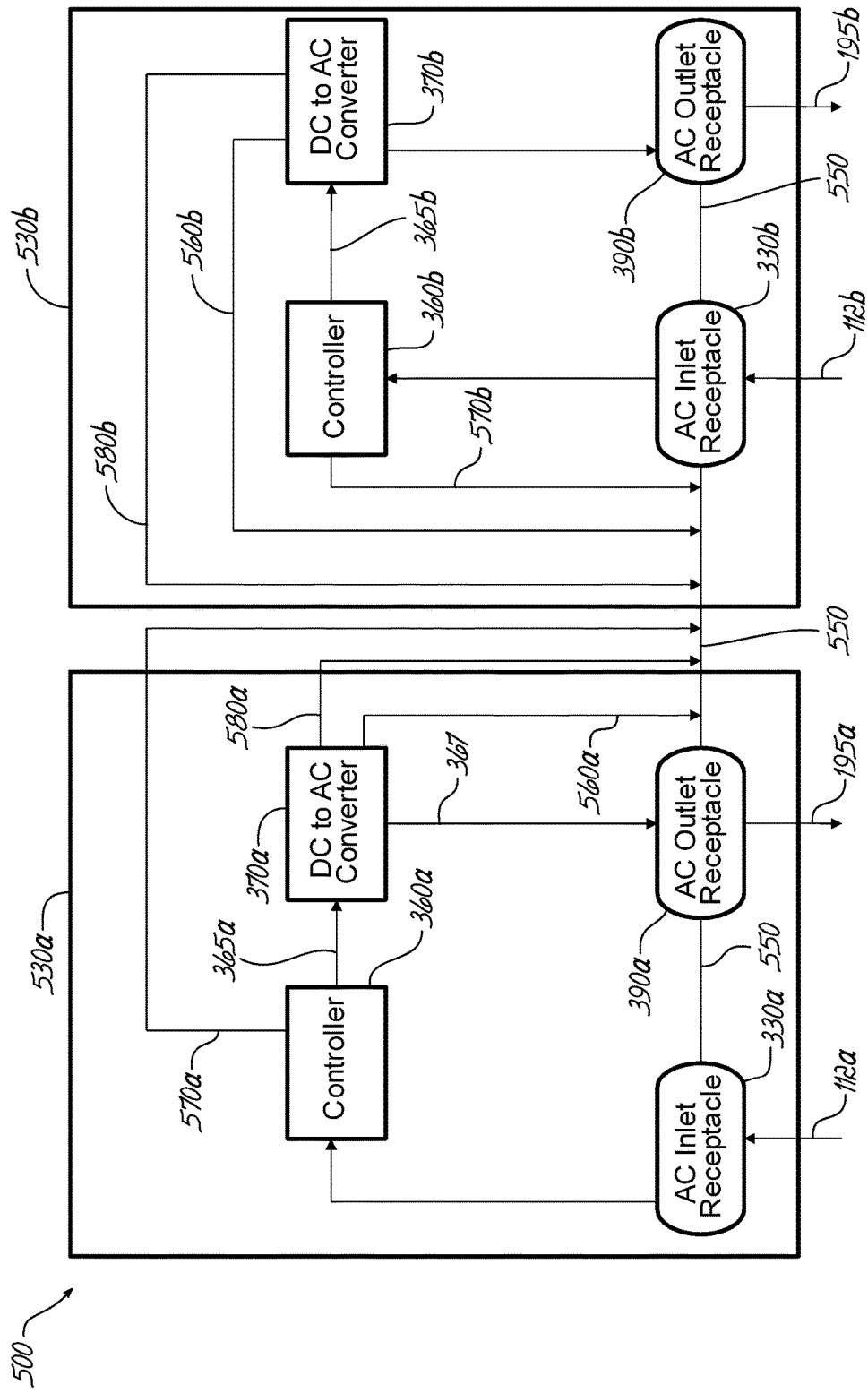
FIG. 4B is a block diagram of an exemplary solar panel that may be used in the solar panel configuration according to one exemplary embodiment of the present disclosure.

FIG. 4B is a block diagram of another exemplary solar panel configuration 500 according to an exemplary embodiment of the present disclosure. Although, FIG. 4B depicts a block diagram of the solar panel configuration 500, FIG. 4B may also depict a block diagram of the plurality of solar panels 100(*a-n*) used in the solar panel configuration 200 depicted in FIG. 2.

The solar panel configuration 500 may be implemented using the master solar panel 530*a* and the slave solar panel 530*b*. The master solar panel 530*a* includes a master AC inlet receptacle 330*a*, a master AC outlet receptacle 390*a*, a master controller 360*a*, and a master DC to AC converter 370*a*. The slave solar panel 530*b* includes a slave AC inlet receptacle 330*b*, a slave AC outlet receptacle 390*b*, a slave controller 360*b*, and a slave DC to AC converter 370*b*. The master solar panel 530*a* and the slave solar panel 530*b* are coupled together by the AC bus 550. The master solar panel 530*a* and the slave solar panel 530*b* share many similar features with the solar panel 100, the plurality of solar panels 100(*a-n*), the solar panel 300, and the solar panel 400; therefore, only the differences between the solar panel configuration 500 and the solar panel 100, the plurality of solar panels 100(*a-n*), the solar panel 300, and the solar panel 400 will be discussed in further detail.

As mentioned, the solar panel 530*a* operates as the master and the solar panel 530*b* operates as the slave. However, as discussed in detail above, the solar panels 530*a* and 530*b* may operate as either the master or slave depending on whether input AC power is applied to the respective AC inlet receptacle of each. The master solar panel 530*a* may apply a constant voltage to an AC bus 550 that is coupling the AC inlet receptacle 330*a* and the AC outlet receptacle 390*a* of the master solar panel 530*a* to the AC inlet receptacle 330*b* and the AC outlet receptacle 390*b* of the slave solar panel 530*b* to maintain the paralleled output AC power generated by the solar panel configuration 500. The slave solar panel 530*b* may increase the current applied to the AC bus 550 when the voltage of the AC bus 550 decreases below the reference voltage due to an external electronic device being coupled to the solar panel configuration 500. The slave solar panel 530*b* may increase the current applied to the AC bus 550 so that the voltage of the AC bus 550 is increased back to the reference voltage so that the paralleled output AC power is maintained to adequately power the external electronic device.

After the master solar panel 530*a* has synchronized with the slave solar panel 530*b*, the external input AC power 112*a* is in parallel with the output AC power 195*a* and the output AC power 195*b* generating the paralleled output AC power. The paralleled output AC power may be accessed by coupling the external electronic device to the master AC outlet receptacle 390*a* and/or the slave AC outlet receptacle 390*b*. The AC bus 550 may provide an access point to the paralleled output AC power for the master controller 360*a* and the slave controller 360*b* to monitor.

The master controller 360*a* may initially instruct the master DC to AC converter 370*a* with a master power conversion signal 365*a* to provide a constant master voltage 560*a* to the AC bus 550 to maintain the paralleled output AC power at a specified level. The specified level may be the maximum output AC power that may be generated by the power converter configuration 500 with the external input AC power 112a in parallel with the output AC power 195a and the output AC power 195b. However, the specified level may be lowered based on the constant master voltage 560a supplied by the master DC to AC converter 370a to the AC bus 550. The specified level may be associated with the reference voltage of the paralleled output AC power. As noted above, the reference voltage of the paralleled output AC power is the voltage level that is to be maintained to generate the paralleled output AC power that is sufficient to power the external electronic device.

After an external electronic device is coupled to the master AC outlet receptacle 390a and/or the slave AC outlet receptacle 390b, the paralleled output AC power may temporarily decrease due to the load applied to the AC bus 550 by the external electronic device. The slave controller 360b may monitor the AC bus 550 with a slave AC bus monitoring signal 570b to monitor the voltage of the AC bus 550 to determine whether the voltage has decreased below the reference voltage of the AC bus 550 which in turn indicates that the paralleled output AC power has decreased below the specified level. The slave controller 360b may then instruct the slave DC to AC converter 370b with a slave power conversion signal 365b to increase the slave current 580b that is provided to the AC bus 550 when the slave controller 360b determines that the voltage of the AC bus 550 decreases after the external electronic device is coupled to the master AC outlet receptacle 390a and/or the slave AC outlet receptacle 390b. The slave current 580b may be increased to a level sufficient to increase the voltage of the AC bus 550 back to the reference voltage. Increasing the voltage of the AC bus 550 back to the reference voltage also increases the paralleled output AC power so that the paralleled output AC power is reinstated to the specified level with a minimal lapse in time. The maintaining of the paralleled output AC power at the specified level prevents a delay in the powering of the external electronic device.

The slave controller 360b may continue to monitor voltage of the AC bus 550 with the slave AC bus monitoring signal 570b to ensure that the voltage of the AC bus 550 does not decrease below the reference voltage. The slave controller 360b may continue to instruct the slave DC to AC converter 370b with the slave power conversion signal 365b to increase or decrease the slave current 580b accordingly based on the voltage of the AC bus 550 to maintain the paralleled output AC power at the specified level.

The slave DC to AC converter 370b may continue to provide the slave current 580b to the AC bus 550 until the slave DC to AC converter 370b no longer has the capability to provide the slave current 580b at the level necessary to maintain the voltage of the AC bus 550 at the reference voltage. For example, the slave DC to AC converter 370b may continue to provide the slave current 580b to the AC bus 550 until the DC source of the slave power converter 530b is drained to the point where the slave DC to AC converter 370b can no longer provide the slave current 580b at the level sufficient to maintain the voltage of the AC bus 550 at the reference voltage.

The master controller 360a also monitors the AC bus 550 with a master AC bus monitoring signal 570a. The master controller 360b monitors the AC bus 550 to determine when the voltage of the AC bus 550 decreases below the reference voltage for a period of time and is not increased back to the reference voltage At that point, the master controller 360a may recognize that the slave DC to AC converter 370b is no longer generating slave current 580b at the level sufficient to maintain the voltage of the AC bus 550 at the reference voltage. The master controller 360a may then instruct the master DC to AC converter 370a with the master power conversion signal 365a to increase the master current 580a to a level sufficient to increase the voltage of the AC bus 550 back to the reference voltage so that the paralleled output AC power may be maintained at the specified level. As a result, a delay in the powering of the external electronic device may be minimized despite the draining of the DC source of the slave power converter 530b.

Figure 5:
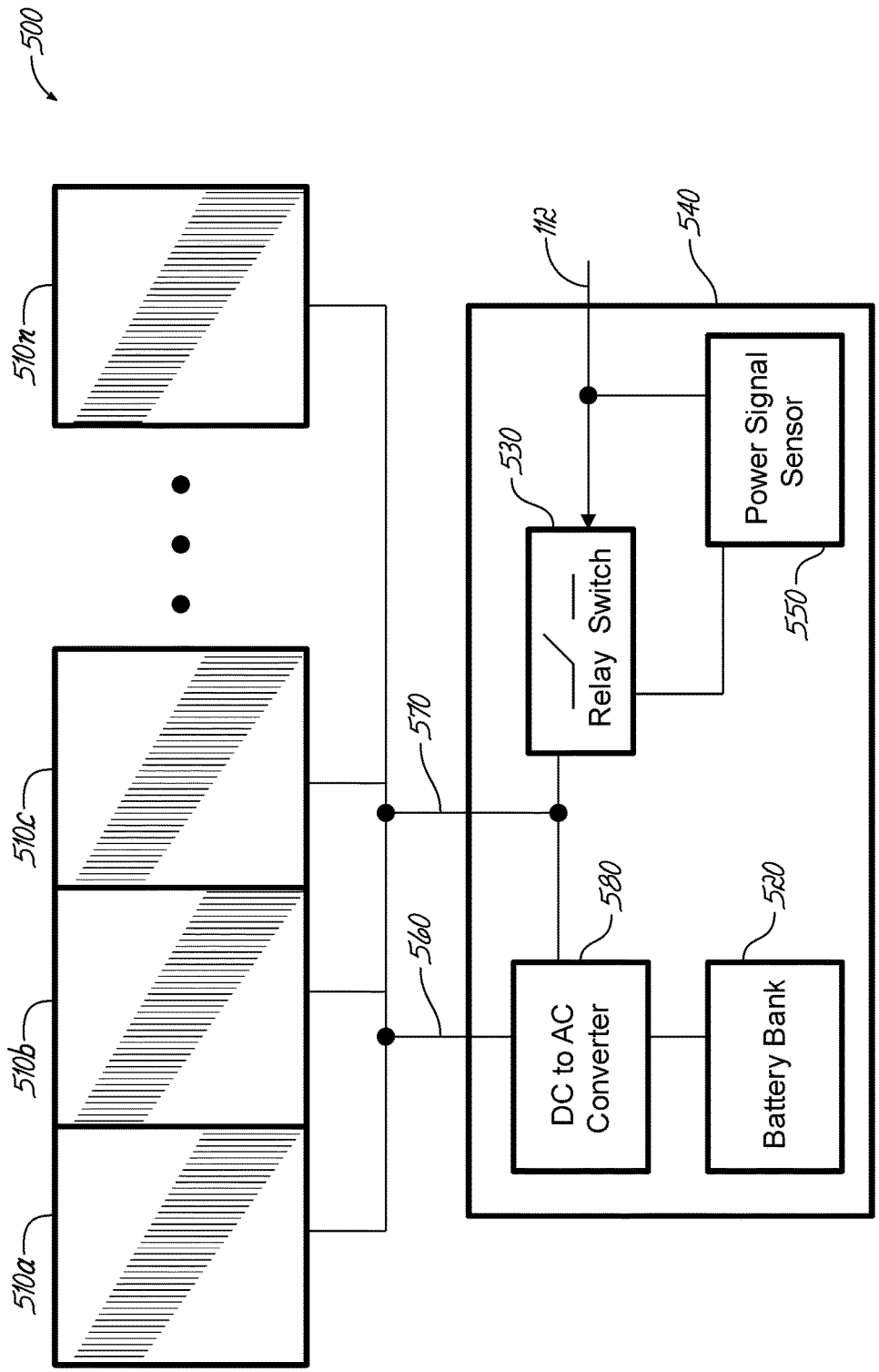
FIG. 5 is a block diagram of an exemplary solar panel configuration according to an exemplary embodiment of the present disclosure.

FIG. 5 illustrates a block diagram of a second exemplary solar panel configuration according to an exemplary embodiment of the present disclosure. The solar panel configuration 500 represents a solar panel configuration that includes a plurality of solar panels 510a through 510n that may be daisy chained together and coupled to a grid tie system 540 to form the solar panel configuration 500, where n is an integer greater than or equal to one. The grid tie system 540 monitors the input AC power 112 that is generated by the grid to determine whether the power grid remains stable to generate the input AC power 112. The grid tie system 540 instructs the battery bank 520 to provide converted AC power 560 to the plurality of solar panels 510a through 510n when the grid tie system 540 determines that the power grid has failed. Thus, the grid system 540 provides back up power to the plurality of solar panels 510a through 510n when the grid fails.

The grid system 540 includes the battery bank 520, a relay switch 530, a DC to AC converter 580 and a power signal sensor 550. The solar panel configuration 500 shares many similar features with the solar panel 100, the plurality of solar panels 100a through 100n, the solar panel 300, the solar panel 400, and the solar panel configuration 200; therefore, only the differences between the solar panel configuration 500 and the solar panel 100, the plurality of solar panels 100a through 100n, the solar panel 300, the solar panel 400, and the solar panel configuration 200 are to be discussed in further detail.

In an embodiment, the plurality of solar panels 510a through 510n may include larger solar panels with larger capacities to capture solar energy and convert the captured solar energy into DC power that may be stored in the battery bank 520. The grid tie system 540 may automatically link the plurality of solar panels 510a through 510n to the input AC power 112 when the grid tie system 540 is grid tied. The grid tie system 540 may also automatically provide the converted AC power 560 to the plurality of solar panels 510a through 510n when the grid tie system 540 is no longer grid tied such that the input AC power 112 is no longer available to the plurality of solar panels 510a through 510n.

In an embodiment, the each of the plurality of solar panels 510a through 510n may be updated as to the status of the grid. For example, the plurality of solar panels 510a through 510n may be updated when the grid fails via a signal that is transmitted through the AC power line of the grid.

In another embodiment, the grid tie system 540 may control the converted AC power 560 so that the DC power stored in the battery bank 520 is not depleted from the use of the converted AC power 560. For example, the grid tie system 540 may dial back the use of the converted AC power 560 from maximum capacity to conserve the DC power stored in the battery bank 520

The grid tie system 540 includes a relay switch 530. The relay switch 530 transitions into an open state (logic 0) when the grid fails and is no longer providing the input AC power 112 to the grid tie system 540 so that the grid tie system 540 may be substantially disconnected from the grid. The grid tie system 540 immediately instructs the DC to AC converter 580 to convert the DC power stored in the battery bank 520 to begin providing the converted AC power 560 the plurality of solar panels 510a through 510n to replace the input AC power 112 no longer supplied to the grid tie system 540. The converted AC power 560 may include power signal characteristics that have already been synchronized with the power signal characteristics included in the input AC power 112 before the grid went down. For example, the converted AC power 560 may include a frequency, phase, amplitude, voltage and/or current that are substantially similar to the frequency, phase, amplitude, voltage and/or current of the input AC power 112. As a result, the plurality of solar panels 510a through 510n fail to recognize that the grid has failed and is no longer providing the input AC power 112 to the grid tie system 540.

After the grid fails, the power signal sensor 550 continues to sense the power signal characteristics on the failed side of the relay switch 530. For example, the power signal sensor 550 continues to sense the voltage, current, frequency, and/or phase on the failed side of the relay switch 530. As the grid begins to come back up, the power signal sensor 550 recognizes that the power signal characteristics on the failed side of the relay switch 530 are beginning to show that the grid is coming back up. As the grid stabilizes, the grid tie system 540 begins to adjust the power signal characteristics of the converted AC power 560 to become substantially equivalent to the power signal characteristics of the input AC power 112 being sensed by the power signal sensor 550. For example, the grid tie system 540 synchronizes the converted AC power 560 so that the frequency, phase, amplitude, voltage and/or current of the converted AC power 560 becomes substantially equivalent to the frequency, phase, amplitude, voltage and/or current of the of the input AC power 112 being sensed by the power signal sensor 550.

After the power signal characteristics of the converted AC power 560 are substantially equivalent to the power signal characteristics of the input AC power 112, the grid tie system 540 transitions the relay switch 530 into a closed position (logic 1). The plurality of solar panels 510a through 510n are no longer running off of the converted AC power 560 but are rather running off of the input AC power 112 provided by the grid.

Figure 6:
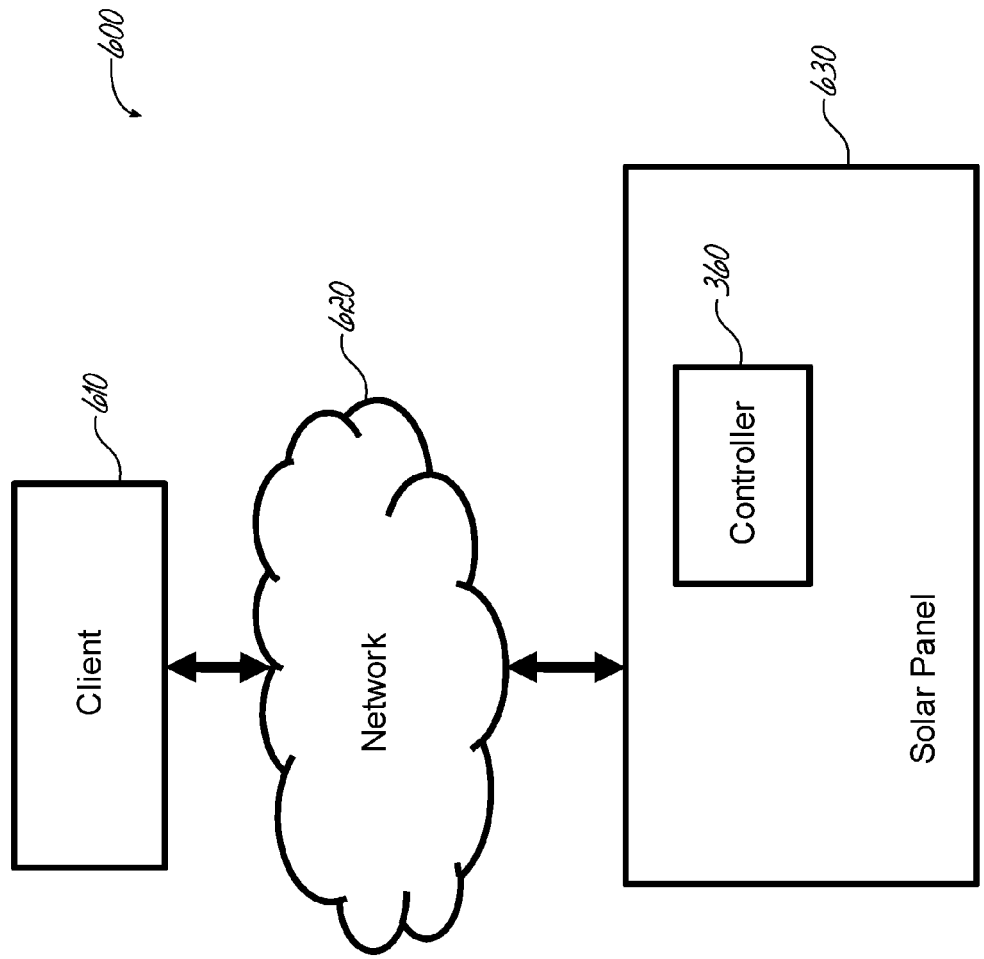
FIG. 6 illustrates a wireless solar panel configuration.

FIG. 6 shows an illustration of a wireless solar panel configuration 600. The wireless solar panel configuration 600 includes a client 610, a network 620, and a solar panel 630.

One or more clients 610 may connect to one or more solar panels 630 via network 620. The client 610 may be a device that includes at least one processor, at least one memory, and at least one network interface. For example, the client may be implemented on a personal computer, a hand held computer, a personal digital assistant ("PDA"), a smart phone, a mobile telephone, a game console, a set-top box, and the like.

The client 610 may communicate with the solar panel 630 via network 620. Network 620 includes one or more networks, such as the Internet. In some embodiments of the present invention, network 620 may include one or more wide area networks ("WAN") or local area networks ("LAN"). Network 620 may utilize one or more network technologies such as Ethernet, Fast Ethernet, Gigabit Ethernet, virtual private network ("VPN"), remote VPN access, a variant of IEEE 802.11 standard such as Wi-Fi, and the like. Communication over network 620 takes place using one or more network communication protocols including reliable streaming protocols such as transmission control protocol ("TCP"). These examples are illustrative and not intended to limit the present invention.

The solar panel 630 includes the controller 360. The controller 360 may be any type of processing (or computing) device as described above. For example, the controller 360 may be a workstation, mobile device, computer, and cluster of computers, set-top box, or other computing device. The multiple modules may also be implemented on the same computing device, which may include software, firmware, hardware, or a combination thereof. Software may include one or more application on an operating system. Hardware can include, but is not limited to, a processor, memory, and a graphical user interface ("GUI") display.

The client 610 may communicate with the solar panel 630 via network 620 to instruct the solar panel 630 as to the appropriate actions to take based on the time of the day, weather conditions, travel arrangements, energy prices, etc. For example, the client 610 may communicate with the solar panel 630 to instruct solar panel 630 to charge its batteries via the input AC power provided by the grid during times of the day in when the sunlight is not acceptable. In another example, the client 610 may communicate with the solar panel 630 via network 620 to instruct the solar panel 630 to operate off of the DC power provided by the internal batteries included in the solar panel 630 during peak utility hours. In such an example, the client 610 may communicate with the solar panel 630 to charge its internal batteries from the solar energy captured by the solar panel 630 during off peak hours while the solar panel 630 relies on the input AC power provided by the grid. The client 610 may then communicate with the solar panel 630 to run off of its charged internal batteries during peak hours when the grid is stressed. In another embodiment, the client 610 may communicate with the solar panel 630 via network 620 to receive status updates of the solar panel 630.

The solar panel 630 may also include a GPS. The client 610 may communicate with the solar panel 630 via network 620 to analyze the GPS coordinates of the solar panel 630 and adjust the solar panel 630 so that the solar panel 630 may face the sun at an angle that maximizes the solar energy captured.

The solar panel 630 may also include a tilt mechanism that is built into its back that has a stepper motor that adjusts the angle of solar panel 630 to maximize its exposure to solar energy.

The client 610 may also remotely control the output AC power of the solar panel 630 via the network 620. Hence, the client 610 may dial back the output AC power of the solar panel 630 so that the DC power stored in the battery bank of the solar panel 630 is not depleted.

In one embodiment, the client 610 may obtain information regarding the solar panel 630 via the network 620 that may include but is not limited to energy produced by the solar panel 630, energy consumed by the solar panel 630, the tilt of the solar panel 630, the angle of the solar panel 630, the GPS coordinates of the solar panel 630, and any other information regarding the solar panel 630 that may be communicated to the client 610 via the network 620 that will be apparent to those skilled in the relevant art(s) without departing from the spirit and scope of the disclosure.

Figure 7B:
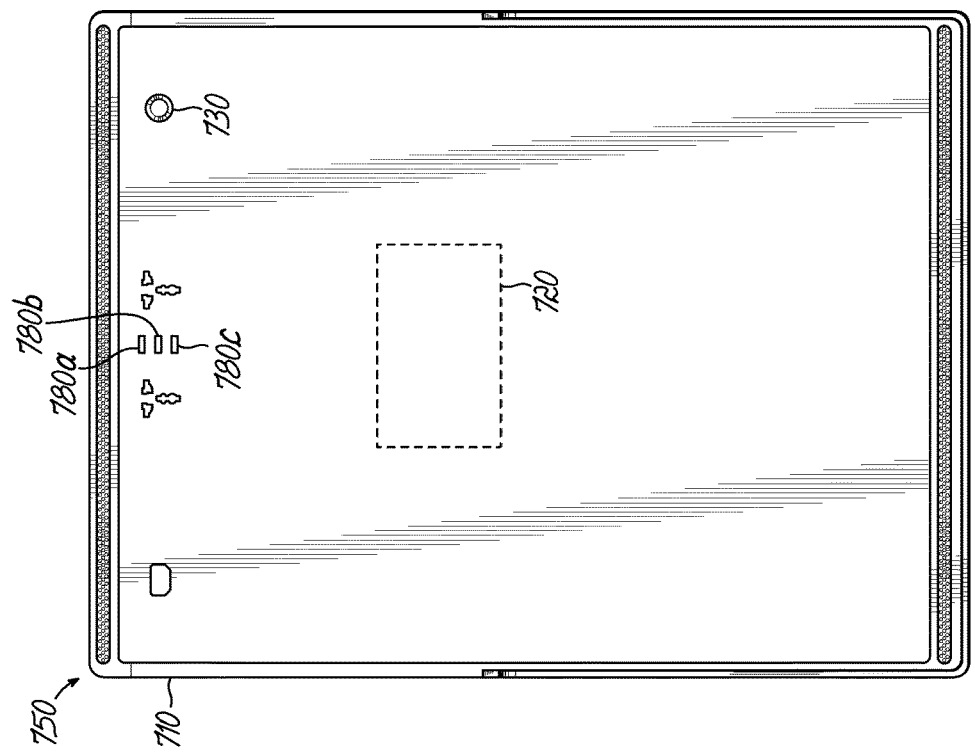
FIG. 7B is top-elevational view of a second side of the exemplary solar panel according to an exemplary embodiment of the present disclosure.
Figure 7A:
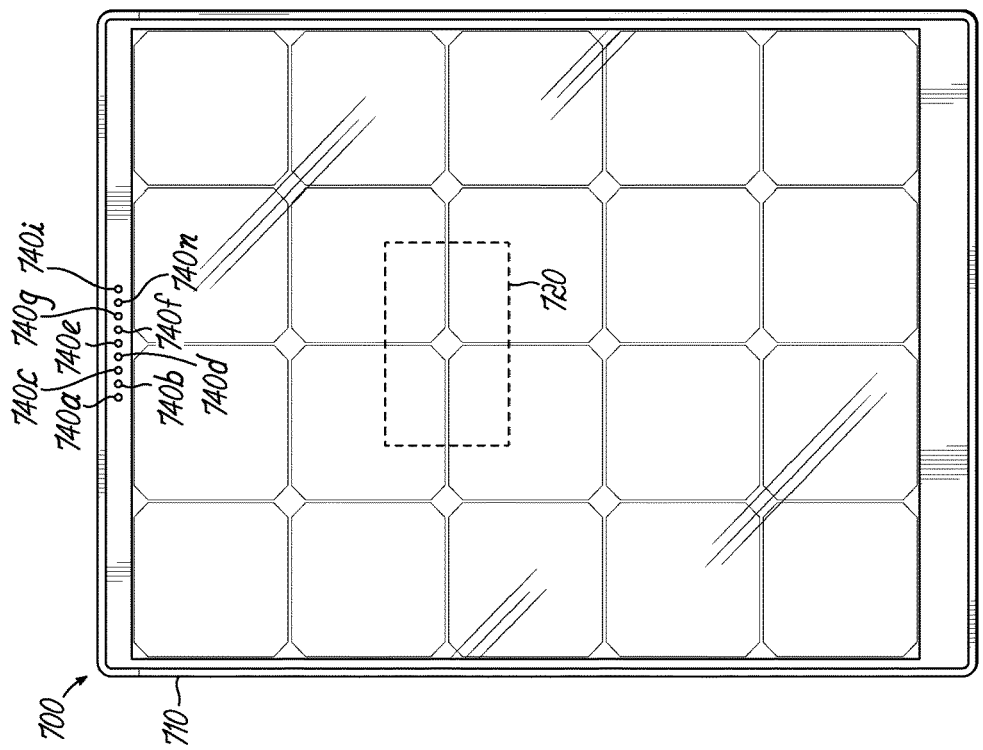
FIG. 7A is a top-elevational view of a first side of an exemplary solar panel that may incorporate a personality engine to interact with the user as the user engages the solar panel according to an exemplary embodiment of the present disclosure.

FIG. 7A is a top-elevational view of a first side 700 of an exemplary solar panel 710 that may incorporate a personality engine 720 to interact with the user as the user engages the solar panel 710 according to an exemplary embodiment of the present disclosure. Similarly, FIG. 7B is top-elevational view of a second side 750 of the exemplary solar panel 710 according to an exemplary embodiment of the present disclosure. Although, FIG. 7A and FIG. 7B depict top-elevational views of the first side 700 and the second side 750 of the solar panel 710, one of ordinary skill art will recognize that FIG. 7A and FIG. 7B may also depict a block diagram of the solar panels 100(*a-n*) in FIG. 2 and FIG. 3, solar panel 300 in FIG. 3, solar panel 400 in FIG. 4, solar panels 530*a* and 530*b* in FIG. 4B, solar panels 510(*a-n*) in FIG. 5, and solar panel 630 in FIG. 6.

The personality engine 720 may operate as the central controller of the solar panel 710 in that the personality engine 720 may orchestrate how the solar panel 710 engages the user as the user interacts with the solar panel 710 as well as how the solar panel 710 responds to operational events that the solar panel 710 encounters. The personality engine 720 may analyze condition data that is generated by different conditions that the solar panel 710 detects that are triggered by different operational events that the solar panel 710 encounters. The personality engine 720 may then select different behavioral actions and initiate execution of the those behavioral actions such that the solar panel responds to each of the operational events encountered by the solar panel 710. The solar panel 710 shares many similar features with the solar panels 100(*a-n*), the solar panel 300, the solar panel 400, the solar panels 530*a* and 530*b*, the solar panels 510(*a-n*), and the solar panel 630; therefore, only the differences between the solar panel 710 and the solar panels 100(*a-n*), the solar panel 300, the solar panel 400, the solar panels 530*a* and 530*b*, the solar panels 510(*a-n*), and the solar panel 630 are to be discussed in further detail.

The solar panel 710 includes the personality engine 720 which enables the solar panel 710 to respond to different operational events that the solar panel engages 710. Rather than simply collecting energy from a light source, converting that collected energy to AC power and then providing the AC power to power devices, the solar panel 710 is customized to execute unique behavioral actions that are specific responses to different operational events that the solar panel 710 encounters. The identification of the different operational events by the personality engine 720 and the unique behavioral actions that are then selected and executed by the personality engine 720 so that the solar panel 710 uniquely responds to the different operational events gives the solar panel 710 a level of personality that distinguishes the solar panel 710 from conventional solar panels.

Operational events that the solar panel 710 may encounter are events that when responded to by the solar panel 710 with behavioral actions may position the solar panel 720 into an improved state due to the potential impact of the operational events on the solar panel 710. For example, the personality engine 720 may identify an operational event that the solar panel 710 has encountered in that the power level of the battery 106 has decreased below a threshold in that any further decrease in the power level of the battery 106 may compromise the capability that the solar panel 710 has to adequately provide power to accommodate the power needs of the user. In response to the operational event of a low power level associated with the battery 106, the personality engine 720 executes an audio recording instructing the user to position the solar panel 710 in direct sunlight to recharge the battery 106.

Operational events that the solar panel 710 may encounter are also events that are triggered by the personality engine 720 executing different features and/or transitioning the solar panel 710 into different modes and/or states and then provides information as to the status of the solar panel 710 when executing different features and/or transitioning into different modes and/or states. For example, the personality engine 720 may identify an operational event that the solar panel 710 has encountered in that the user presses a push button 730 positioned on the second side 750 of the solar panel 710 due to the user requesting to activate the solar panel 710. As the user presses the push button 730, the personality engine 720 recognizes that the solar panel 710 was initially in the deactivated state and the pressing of the push button 730 by the user is an action by the user requesting that the solar panel 710 transition into the activated state. Rather than simply have the solar panel 710 transition into the activated state without providing any affirmative information to the user that the solar panel 710 is indeed transitioning to the activated state, the personality engine 720 executes an audio recording informing the user that the solar panel 710 is indeed activating.

Operational events that the solar panel 710 may encounter are also environmental events that the solar panel 710 encounters and when responded to by the solar panel 710 with behavioral actions may position the solar panel 720 into an improved state due to the potential impact of the environmental events on the solar panel 710. For example, the personality engine 720 may identify an operational event that the solar panel 710 has encountered in that the humidity within the enclosure of the solar panel 710 exceeds a level that indicates an increased likelihood that moisture has penetrated the solar panel 710. The personality engine 720 recognizes that moisture may be present within the solar panel 710 due to the increased humidity level and deactivates the components included in the solar panel 710 that require high levels of voltage to operate. The deactivation of the components requiring high levels of voltage prevents damage to the high voltage components and/or from those high voltage components causing damage to other portions of the solar panel 710 should those high voltage components be exposed to moisture when operating.

Operational events may include events that when responded to by the solar panel 710 position the solar panel 710 into an improved state, events that are triggered by the personality engine 720 executing different features and/or transitioning the solar panel 710 into different modes and/or states, environmental events that the solar panel 710 has encountered and/or any other type of event that the solar panel 710 may encounter in which a behavioral response executed by the personality engine 720 in response to the operational event positions the solar panel 710 in an improved state and/or provides additional information to the user as to the state of the solar panel 710 that will be apparent to those skilled in the relevant arts) without departing from the spirit and scope of the disclosure.

A behavioral action is an action executed by the personality engine 720 that triggers the solar panel 710 to respond to a specified operational event in a specific manner. Rather than having the solar panel 710 simply execute actions as requested by the user, the personality engine 720 identifies the different operational events that the solar panel 710 is encountering and then selects a specific behavioral action that when executed is a response to the specified operational event that the solar panel 710 is encountering. For example, the personality engine 720 detects a behavioral action in that the user is attempting to deactivate the solar panel 710 as the user presses the push button 730. The personality engine 720 recognizes that the solar panel 710 is in the activated state and the pressing of the push button 730 by the user indicates that the user is requesting to deactivate the solar panel 710.

Rather than simply have the solar panel 710 transition into the deactivated state without providing any affirmative information to the user that the solar panel 710 is indeed transitioning to the deactivated state, the personality engine 720 executes an audio recording informing the user that the solar panel 720 is indeed deactivating. A behavioral action selected and executed by the personality engine 720 may be any type of action and/or variation of action that responds to the operational event that the solar panel 710 is encountering that will be apparent to those skilled in the relevant art(s) without departing from the spirit and scope of the disclosure.

The personality engine 720 determines the behavioral action to execute in response to each behavioral action encountered by the solar panel 710 based on condition data that is provided by condition detection devices that are included in the solar panel 710. The condition detection devices included in the solar panel 710 detect different conditions triggered by corresponding operational events that the solar panel 710 is encountering. A condition is the result of a corresponding operational event that is detectable by a condition detection device and/or the personality engine 720. Each operational event that the solar panel 710 encounters triggers conditions that are specific to the operational event. For example, the solar panel 710 absorbs a level of impact when the solar panel 710 is dropped to the ground. The level of impact is a condition that is triggered by the operational event of the solar panel 710 being dropped to the ground. The level of impact is detectable by a three-dimensional accelerometer that is included in the solar panel 710.

The condition detection devices included in the solar panel 710 are devices that are capable of detecting the different type of conditions that are triggered by each of the operational events that the solar panel 710 encounters. For example, the condition detection devices include a three-dimensional accelerometer, a three-dimensional compass, temperature sensors, a humidity sensor, power measuring devices, voltage measuring devices, clocks, ambient light meter devices, and/or any other type of condition detection device that detects conditions that are triggered by operational events that enables the personality engine 720 to execute behavioral actions in response to the operational events that will be apparent to those skilled in the relevant art(s) without departing from the spirit and scope of the disclosure.

Each of the condition detection devices included in the solar panel 710 generate condition data that is associated with each of the conditions triggered by the operational events that the solar panel 710 is encountering. The condition data provides information as to the conditions that have been detected by the condition detection devices and may be analyzed by the personality engine 720 to determine the behavioral actions that are to be executed to respond to the behavioral conditions encountered by the solar panel 710.

For example, the three-dimensional accelerometer generates condition data that is associated with the level of impact that the solar panel 710 has absorbed when the solar panel 710 encountered the operational even of being dropped to the ground. The personality engine 720 may then analyze the condition data associated with the level of impact to determine that a behavioral action in making the user aware that the solar panel 710 has suffered an impact is appropriate. In doing so, the personality engine 720 executes an audio recording that states "Ouch!" The user is then aware to be more cautious to prevent the solar panel 710 from inducing similar impacts in the future.

Rather than having a cumbersome liquid crystal display (LCD) for the user to interact with the solar panel 710, the personality engine 720 provides the user with a more interactive experience with the solar panel 710 in which the personality engine 720 provides the solar panel 710 with an appearance of having a personality. For example, the personality engine 720 executes behavioral actions that are in response to actions executed by the user such as tapping on the solar panel 710 and/or pressing the push button 730.

In executing the behavioral actions, the personality engine 720 may accompany the execution of the behavioral actions with the execution of audio recordings that informs the user of the status of the solar panel 710. For example, the user may activate the flashlight by pressing the push button 730 in a sequence of pushes that indicates the user is attempting to activate the flashlight associated with the solar panel 710. The personality engine 720 may then activate the flashlight by activating light emitting diodes (LEDs) 740(a-n), where n is an integer equal to or greater than one, that emit light and different intensities and operates as a flashlight as requested by the user based on the sequence of pushes that the user presses the push button 730. With each different sequence of pushes of push button 730, the user may instruct the personality engine 720 that the user requests to adjust the intensity of the light emitted by LEDs 740 as the flashlight.

The user may also request to activate an emergency light based on a sequence of pushes of push button 730. In doing so, the personality engine 720 then activate the LEDs 740(a-n) to emit light at high intensity level and to flash. The flashing LEDs 740(a-n) may then signal to an observer that the user associated with the solar panel 800 is in distress and requires assistance. The user may also request to adjust the colors of the light emitted by the LEDs 740(a-n) as requested by the user. Rather than simply adjusting the intensity of the light, activating the emergency light, and/or adjusting the colors of the light, the personality engine 720 may also inform the user that the flashlight has been activated with an audio recording informing the user that the flashlight has been activated.

In addition to the personality engine 720 executing the appropriate audio recording to inform the user of the status of the solar panel 710 in response to the different operational events that the solar panel 710 has encountered, the personality engine 720 may also flash the LEDs 740(a-n) in correlation with the audio recording that is being played. For example, the personality engine 720 instructs the LEDs 740(a-n) to flash in synchronization with each syllable articulated in the audio recording. As the personality engine 720 executes the audio recording of "I am the light in the darkness" to provide the user the status that the flashlight has been activated, the personality engine 720 also simultaneously instructs the LEDs 740(a-n) to flash in synchronization with the syllables of "I am the light in the darkness." In doing so, the personality engine 720 provides a user experience with the solar panel 710 that enables the user to interact with the solar panel 710 as if the solar panel 710 has a personality.

The personality engine 720 further enhances the personality of the solar panel 710 by providing variation in the type of behavioral action that is executed by the personality engine 720 so that the solar panel 710 responds to the specified operational event that the solar panel 710 is encountering. Rather than executing the same behavioral action in response to a corresponding operational event that the solar panel 710 is encountering, the personality engine 720 may execute different variations of the behavioral action that still adequately responds to the operational event but does so in a manner that differs each time the solar panel 710 encounters the operational event.

For example, each time the user presses the push button 730 when the solar panel 710 is in the activated state, the personality engine 720 recognizes that the user is requesting to deactivate the solar panel 710. In order to adequately respond to the operational event in the user requesting to deactivate the solar panel 710, the personality engine 720 does execute the same behavioral action in initiating the deactivation process of the solar panel 710 each time the user requests to deactivate the solar panel.

However, the personality engine 720 provides variation in the audio recording that the personality engine 720 executes each time the user requests to deactivate the solar panel 710. In response to a first instance when the user requests to deactivate the solar panel 710, the personality engine 720 selects and executes an audio recording of "the solar panel is shutting down." In response to a second instance when the user requests to deactivate the solar panel 710, the personality engine 720 selects "I will be here when you need me." Thus, each time the user requests to deactivate the solar panel 710, the personality engine 720 may provide variation in the type of audio recording played for the user that provides information to the user as to the status of the solar panel 710.

The personality engine 720 may select the behavioral action that is executed in response to the operational event that the solar panel 710 is encountering based on an operational event category that the conditions triggered by the operational event are categorized within. The personality engine 720 may initially analyze the condition data associated with each condition detected by the condition detection devices as triggered by the operational event that the solar panel 710 is encountering. Based on the condition data associated with each condition, the personality engine may determine the type of operational event that triggered each of the conditions detected by the condition detection devices. For example, the personality engine determines the user pressing the push button 730 when the solar panel 710 is in the deactivated state is a type of operational event associated with activating the solar panel 710.

The personality engine 720 may then categorize each of the conditions triggered by the operational events that the solar panel 710 encounters into different operational event categories based on the type of operational event that triggered each of the conditions. Each of the operational event categories includes operational events that are similar and may have similar behavioral actions that when executed by the personality engine 720 are adequate responses to the operational events included in the same operational event category.

The personality engine 720 may also associate the different behavioral actions that the personality engine 720 may execute with an appropriate operational event category. In doing so, each behavioral action included in an operational event category when executed by the personality engine 720 may be an adequate response to the operational events that are included in the operational event category. For example, the personality engine 720 categorizes conditions triggered by the user attempting to activate the solar panel 710 into the solar panel activation operational event category. Behavioral actions such as executing different audio recordings that include "I am ready to go" or "Solar Panel activated" by the personality engine 720 are operational events that adequately respond to the operational event of the user attempting to activate the solar panel 710.

For each condition triggered by an operational event, the personality engine 720 may randomly select a behavioral action that is associated with the operational event category that includes the operational event that the solar panel 710 is encountering. As noted above, the personality engine 720 associates each behavioral action with an operational event category so that when executed by the personality engine 720, the executed behavioral action is an adequate response to the operational event encountered by the solar panel 710.

In order to provide variation to the behavioral actions executed by the personality engine 720 in response to the different operational events encountered by the solar panel 710, the personality engine 720 may select from numerous different behavioral actions in response to a specified operational event with each of the different behavioral actions being an adequate response to the specified operational event by the solar panel 710. The personality engine 720 may further enhance the variation in executing different behavioral actions by randomly selecting the behavioral action from behavioral actions that are associated with the operational event category for the operational event that the solar panel 710 is encountering. In doing so, the personality engine 720 selects and then executes a behavioral action that is an adequate response to the operational event since each of the behavioral actions associated with the operational event category that includes the operational event is an adequate response to the operational event while providing variation by randomly selecting the behavioral action.

For example, the user presses the push button 730 in a sequence of pushes such that the personality engine 720 identifies as the user attempting to activate the flashlight. The personality engine 720 identifies the sequence of pushes as the operational event of the user attempting to activate the flashlight and determines that the flashlight activation operational event category is the appropriate operational event category. In addition to activating the LEDs 740(a-n) to emit light as the flashlight, the personality engine 720 also randomly selects a behavioral action from the different behavioral actions associated with the flashlight activation operational event category.

For example, in a first instance when the user attempts to activate the flashlight, the personality engine 720 randomly selects to play the audio recording of "Flashlight On" to accompany the activating of the LEDs 740(a-n). In a second instance, the user attempts to activate the flashlight, the personality engine randomly selects to play the audio recording of "I am the light in the darkness" to accompany the activating of the LEDs 740(a-n). Each of the different audio recordings that are associated with the flashlight activation operational event category is a sufficient response to the operational event of the user requesting to activate the flashlight along with the actual activation of the LEDs 740(a-n). The random selection of each of the audio recordings associated with flashlight activation operational event category then provides variation in the different responses of the solar panel 710 to the specified operational event of the user requesting to activate the flashlight.

The personality engine 720 may also execute random behavioral actions that correspond to a specified operational event. Unlike the behavioral actions that are randomly selected and executed by the personality engine 720 in which the executed behavior actions are responses to the operational events that the solar panel 710 is encountering, the random behavioral actions are responses that are unrelated to the specified operational event that triggers the random behavioral actions. The random behavioral actions are actions executed by the personality engine 720 that do not put the solar panel 710 in a better condition after encountering the specified operational event and/or provide information to the user as to the status of the solar panel 710 after encountering the specified operational event. Rather, the random behavioral actions are actions executed by the personality engine 720 that may be humorous to the user and/or improve the user's experience with the solar panel 710 due to the spontaneity of the random behavioral actions.

For example, personality engine 720 may execute a random behavioral action of executing an audio recording of "shave and a haircut, two bits" in response to the user tapping the top right corner of the first side 700 of the solar panel 710. The executing of the audio recording "shave and a haircut, two bits" is unrelated to the user tapping the top right corner. Unlike the personality engine 720 executing behavioral actions in response to a behavioral action such as the user pressing the push button 730 in a sequence of pushes after the flashlight has been activated to deactivate the flashlight, the execution of the audio recording "shave and a haircut, two bits" is unrelated to the specified operational event of the user tapping the top right corner of the first side 700.

The specified operational events that trigger the random behavioral actions executed by the personality engine 720 are operational events that do not have an impact on the solar panel 710, such as condensation build up in the solar panel 710, and/or are not associated with a request by the user, such as activating and/or deactivating the flashlight. Rather, the specified operational events are operational events that simply trigger the random behavioral action and have no impact on the solar panel 710 and/or satisfying the needs of the user. For example, the tapping of the top right corner of the first side 700 of the solar panel 710 has no impact on the operation of the solar panel 710 and is not executed by the user as a request by the user for the solar panel 710 to satisfy a need of the user.

The personality engine 720 may associate each of the random behavioral actions to a corresponding specified operational event such the personality engine 720 executes the random behavioral action associated with the corresponding specified event when the personality engine 720 detects the condition triggered by the corresponding specified event. However, each of the specified operational events as well as the random behavioral actions executed by the personality engine 720 in response to the specified operational event may be initially unknown to the user. As noted above, random behavioral actions as well as the specific operational events have no impact on the solar panel 710 and/or satisfying the needs of the user. Thus, the random behavioral actions executed by the personality engine 720 that are initially unknown to the user in response to the specified operational events that are initially unknown to the user may surprise the user and trigger personal enjoyment for the user.

For example, the user manual provided with the solar panel 710 may provide no mention as to the random behavioral action that is executed by the personality engine 720 when the user taps the bottom left corner of the second side 750 of the solar panel 710. Tapping the bottom left corner of the second side 750 of the solar panel 710 is a specified operational event that has no impact on the solar panel 710 and/or satisfying the needs of the user and is thus not mentioned in the user manual provided with the solar panel 710. However, the user when moving the solar panel 710 accidentally taps the bottom left corner of the second side 750 of the solar panel 710 with the user's toes.

The personality engine 720 associates the specified operational event of tapping the bottom left corner of the second side 750 of the solar panel 710 with the random behavioral action of executing the audio recording of "this solar panel will self-destruct in four . . . three . . . two . . . one" and executes that audio recording. The execution of such an audio recording is unrelated to the specified operational event of tapping of the bottom left corner of the second side 750 of the solar panel 710 in that such a random behavioral action does not improve the condition of the solar panel 710 after encountering the tapping of the bottom left corner of the second side 750 and/or provide information to the user. Rather, such a random behavioral action is a surprise to the user and provides humor to the user's interaction with the solar panel 710.

After accidentally encountering different random behavioral actions previously unknown to the user that were triggered by different specified operational events previously unknown to the user, the user may realize that the personality engine 720 may execute numerous random behavioral actions that are currently unknown to the user. The user may then further engage the solar panel 710 by executing different types of operational events that have no impact on the solar panel 710 and/or satisfying the needs of the user in an attempt to uncover additional random behavioral actions for the user. The user may even turn to social media to learn of other specified operational events that triggered random behavioral actions as discovered by other users to uncover additional unknown specified operational events. The personality engine 720 triggering a type of hunt for the user in attempting to uncover different random behavioral actions as triggered by previously unknown specified operational events may further enhance the user's experience with the solar panel 710 as well as further develop the user's actual relationship with the solar panel 710.

Figure 8:
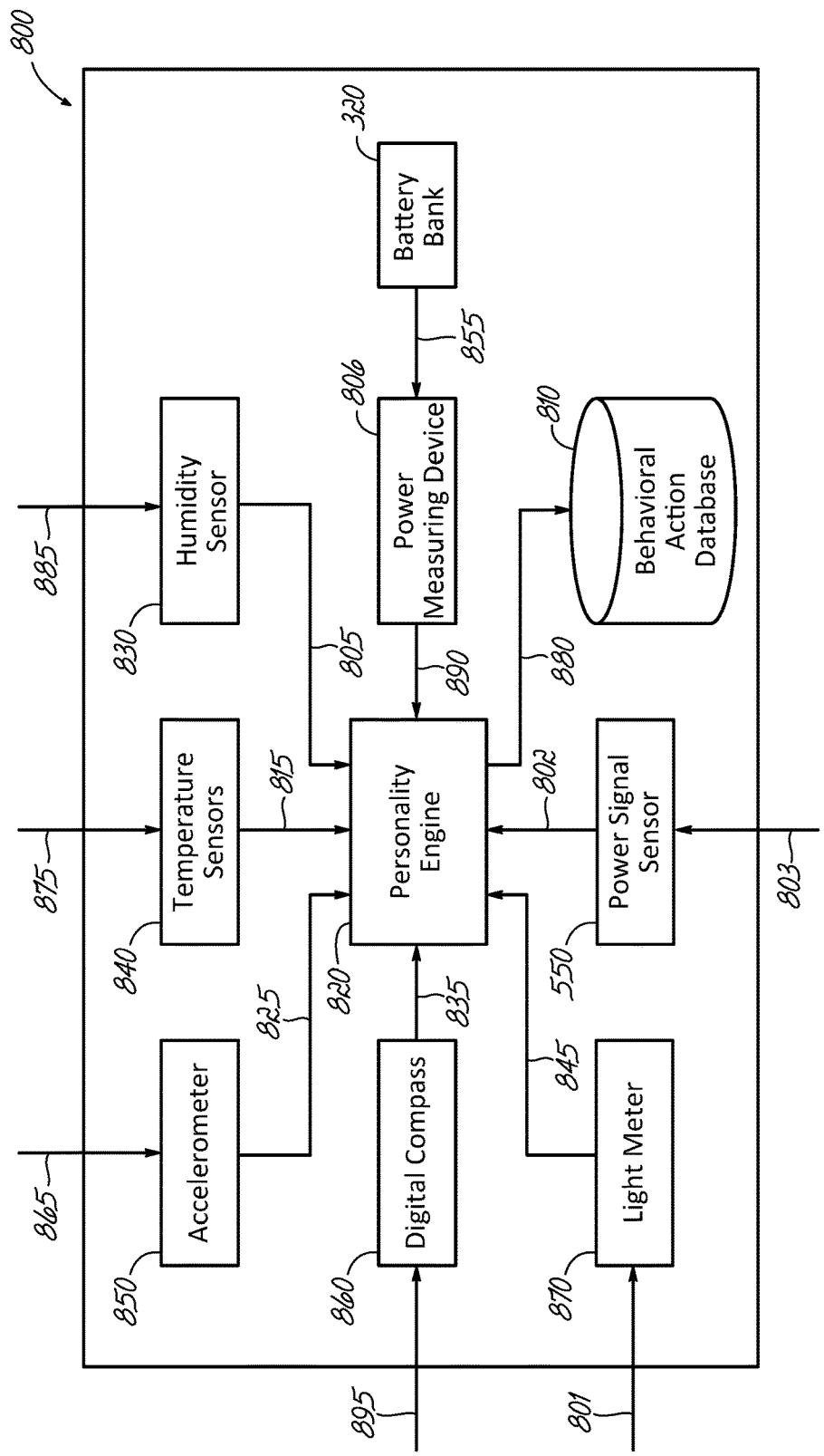
FIG. 8 is a schematic diagram of another exemplary solar panel that may incorporate a personality engine to interact with the user as the user engages the solar panel according to an exemplary embodiment of the present disclosure.

FIG. 8 is a schematic diagram of another exemplary solar panel 800 that may incorporate a personality engine 820 to interact with the user as the user engages the solar panel 800 according to an exemplary embodiment of the present disclosure. Although, FIG. 8 depicts a schematic diagram solar panel 800, one of ordinary skill art will recognize that FIG. 8 may also depict a block diagram of the solar panels 100(a-n) in FIG. 2 and FIG. 3, solar panel 300 in FIG. 3, solar panel 400 in FIG. 4, solar panels 530a and 530b in FIG. 4B, solar panels 510(a-n) in FIG. 5, solar panel 630 in FIG. 6, and the solar panel 710 in FIG. 7A and FIG. 7B.

The personality engine 820 may operate as the central controller of the solar panel 800 in that the personality engine 820 may orchestrate how the solar panel responds to operational events that the solar panel 800 encounters. The personality engine 820 may analyze condition data that is generated by different conditions that the different condition detection devices detect and are triggered by the different operational events that the solar panel 800 encounters. The personality engine 820 may then select different behavioral actions and initiate execution of the those behavioral actions such that the solar panel 800 responds to each of the operational events encountered by the solar panel 800. The solar panel 800 shares many similar features with the solar panels 100(a-n), the solar panel 300, the solar panel 400, the solar panels 530a and 530b, the solar panels 510(a-n), the solar panel 630, and the solar panel 710; therefore, only the differences between the solar panel 800 and the solar panels 100(a-n), the solar panel 300, the solar panel 400, the solar panels 530a and 530b, the solar panels 510(a-n), the solar panel 630, and the solar panel 710 are to be discussed in further detail.

As noted above, the personality engine 820 may analyze condition data that is provided by each of the condition detection devices as each of the condition detection devices detect conditions triggered by operational events that the solar panel 800 is encountering. The personality engine 820 may then select and execute behavioral actions based on the condition data associated with the conditions detected by the condition detection devices in response to each operational event the solar panel 800 encounters.

In order to bring variation to the different behavioral actions executed by the personality engine 820, the personality engine 820 may categorize each of the conditions into operational event categories as stored in the behavioral action database 810. The personality engine 820 may then identify the appropriate operational event category based on the conditions detected by the condition detection devices and randomly select a behavioral action from the behavioral actions that are associated with the appropriate operational event category. In executing the randomly selected operational event category by the personality engine 820, the solar panel 800 adequately responds to the operational event that the solar panel 800 is encountering.

In an embodiment, the personality engine 820 may select and execute behavioral actions associated with the amount of power available in the battery bank 320. A condition detection device, such as the power measuring device 806, may monitor the power level of the battery bank 320 and provide condition data that indicates the power level of the battery bank 320 to the personality engine 820. For example, the power measuring device 806 may monitor the power level signal 855 as provided by the battery bank 320 in which the power level signal 855 provides the amount of power that is currently stored in the battery bank 320. The power measuring device 806 may then generate the power level signal 890 that contains condition data that indicates the power level of the battery bank 320 to the personality engine 820.

The personality engine 820 may analyze the condition data provided in the power level signal 890 to determine the appropriate behavioral action that is to be executed in response to the current power level of the battery bank 320. The personality engine 820 may activate the LEDs 740(*a-n*) in a manner that corresponds to the current power level of the battery bank 320 such that the user may have a visual indication as to the amount of power currently available in the battery bank 320.

For example, the personality engine 820 may activate each of the LEDs 740(*a-n*) when the battery bank 320 is fully charged and is currently storing a maximum level of power. The personality engine 820 may only activate a single LED in 740*a* when the battery bank 320 is currently storing little power and is at risk of having no power available should the user continue to power devices without charging the battery bank 320. The personality engine 820 may activate LEDs 740(*a-e*) when the battery bank 320 is currently storing an intermediate level of power. Thus, the amount of LEDs 740(*a-n*) activated by the personality engine 820 increases as the power level of the battery bank 320 increases and decreases the amount of LEDs 740(*a-n*) that are activated as the power level of the battery bank 320 decreases.

In addition to the LED 740(*a-n*) activation to correspond to the amount of power available in the battery bank 320, the personality engine 820 may also monitor the power level signal 890 to determine whether the power level signal 890 dips below a threshold. The threshold may be a power level of the battery bank 320 that when the power level dips below the threshold, the user is at risk of no longer being able to power devices if the user does not take action to charge the battery bank 320. The user may not always be aware of the visual indication of the power level of the battery bank 320 as presented by the activation of the corresponding LEDs 740(*a-n*). Rather than simply have the battery bank 320 be drained of any remaining power by the user unknowingly continue to operate devices, the personality engine 820 may execute an audio recording that instructs the user that the power level of the battery bank 320 is decreasing and that the user should take action to charge the battery bank 320.

In order to provide variation to the audio recording executed by the personality engine 820 when the power level of the battery 320 decreases below the threshold, the personality engine 820 may categorize the power level of the battery bank 320 decreasing below the threshold as being in a battery level operational event category. The personality engine 820 may then generate a behavioral action signal 880 in which the personality engine 820 queries the behavioral action database 810. The behavioral action database 810 may store each of the different operational event categories as well as each of the behavioral actions that are associated with each of the different operational event categories. As noted above, each of the different operational event categories have several behavioral events associated with them such that any of the behavioral actions associated with an operational event category may be an adequate response of the solar panel 800 to the operational event.

In the current example, the personality engine 820 may generate the behavioral action signal 880 to query the battery level operational event category to randomly select an audio recording that instructs the user that the user is at risk of no longer being able to power devices unless the battery bank 320 is charged. In a first instance, the personality engine 820 may randomly select the audio recording "place me in direct sunlight" to instruct the user to charge the battery bank 320 by placing the solar panel 800 in direct sunlight as associated with the battery level operational event category stored in the behavioral action database 810. In a second instance, the personality engine 820 may randomly select the audio recording "the battery level has reached a critical low."

The personality engine 820 may also monitor the power level signal 890 when the solar panel 800 operates in a sleep mode. The sleep mode may be activated by the user when the user intends to strictly operate the solar panel 800 during emergency situations such as when the electric utility grid is no longer providing an adequate AC power such as during a black out and/or brown out. The battery bank 320 may store power for up to and/or beyond a year before the battery bank 320 begins to lose the power. The personality engine 820 may periodically execute the behavior action of waking up and periodically monitoring the power level signal 890 to determine whether the battery bank 320 still stores sufficient power to satisfy the power requirements of the user if activated. The personality engine 820 when in sleep mode may then notify the user when the personality engine 820 detects that the power level signal 890 dips below the threshold such that the battery bank 320 to instruct the user that the battery bank 320 is no longer storing sufficient power to satisfy the power requirements of the user if activated and that the user should charge the battery bank 320.

Each of the behavioral actions associated with a particular operational event category may have a number associated with it. A random number generator may then randomly generate a number that is associated with one of the behavioral actions for the particular operational event category. Based on the random number generated by the random number generator, the personality engine 820 may then randomly select and execute the behavioral action that is associated with the number randomly generated by the random number generator. The personality engine 820 may randomly select the behavioral action based on any type of random selection methodology that will be apparent to those skilled in the relevant art(s) without departing from the spirit and scope of the disclosure.

In an embodiment, the personality engine 820 may select and execute behavioral actions associated with a physical impact that that the solar panel 800 absorbs. A condition detection device, such as the accelerometer 850, may provide the solar panel 800 with touch recognition. The accelerometer 850 may detect a level of physical impact that the solar panel 800 may absorb, the location of the physical impact on the solar panel 800, as well as a sequence of physical impacts, such as the user tapping the solar panel 800 twice on the top right corner of the first side 700 of the solar panel 800. The accelerometer 850 may provide condition data that provides information as to the physical impact absorbed by the solar panel 800 such as the impact level, the location, and/or any sequence of physical impacts to the personality engine 820.

For example, the accelerometer 850 may monitor a physical impact signal 865 as triggered by a physical impact absorbed by the solar panel 800. The accelerometer 850 may then generate the physical impact data signal 825 that contains condition data that indicates the type of physical impact absorbed by the solar panel 800 such as the level of physical impact, the location, and/or the sequence of physical impacts to the personality engine 820. The accelerometer 850 may be a three-dimensional accelerometer and/or any other type of accelerometer that will be apparent to those skilled in the relevant art(s) without departing from the spirit and scope of the disclosure.

The personality engine 820 may analyze the condition data provided in the physical impact data signal 825 to determine the appropriate behavioral action that is to be executed in response to the physical impact absorbed by the solar panel 800. For example, the personality engine 820 may monitor the physical impact data signal 825 to determine whether the physical impact data signal 825 exceeds a threshold. The threshold may be a level of physical impact that when exceeded is a strong indication that the solar panel 800 has absorbed a strong physical impact. The user may not always handle the solar panel 800 with caution and may bump the solar panel 800, knock the solar panel 800 over, and so on. The personality engine 820 may make the user aware that the solar panel 800 has suffered a strong physical impact and instruct the user to incorporate caution when handling the solar panel 800 by executing an audio recording that provides this information to the user.

In order to provide variation to the audio recording executed by the personality engine 820 when the accelerometer 850 detects a physical impact that exceeds the threshold, the personality engine 820 may categorize the physical impact detected by accelerometer 850 that exceeds the threshold as being in a physical impact operational event category. The personality engine 820 may then generate the behavioral action signal 880 in which the personality engine 820 queries the behavioral action database 810. The personality engine 820 may generate the behavioral action signal 880 to query the physical impact operational event category to randomly select an audio recording that informs the user that solar panel 800 has absorbed an impact and that greater caution should be used by the user. In a first instance, the personality engine 820 may randomly select the audio recording "if you keep doing that, you will void your warranty" to instruct the user that the solar panel 800 has absorbed a physical impact that exceeds the threshold and that greater caution should be implemented. In a second instance, the personality engine 820 may randomly select the audio recording "I have fallen and I can't get up."

The personality engine 820 may also analyze the physical impact data signal 825 to determine the sequence of physical impacts as detected by the accelerometer 850. The user may interact with the solar panel 800 via touch recognition in which the user touches the solar panel 800 in specific locations and/or with a sequence of physical impacts. Based on the location of the touches by the user and/or the sequence of touches executed by the user, the personality engine 820 may associate the location and/or sequence of touches with a behavioral action that is to be executed by the personality engine 820 in response to the location and/or sequence of touches.

For example, the user may touch the solar panel 800 with a series of three taps. The accelerometer 850 may identify the series of three taps as detected via the physical impact signal 865 that is generated by the user touching the solar panel 800 with the series of three taps. The personality engine 820 may then analyze the physical impact data signal 825 as provided by the accelerometer 850 that includes the condition data associated with the series of three taps. The personality engine 820 may determine that the level of physical impact created by the three taps is below the threshold indicating that the three taps were not caused by an unwanted physical impact absorbed by the solar panel 800, such as the solar panel 800 being knocked over. The personality engine 820 may then associate the sequence of three taps that have physical impact levels below the threshold as having to execute the behavioral action of executing an audio recording to the user as to the remaining wattage of power stored in the battery bank 320.

In an embodiment, the personality engine 820 may select and execute behavioral actions associated with the temperature of the solar panel 800 and/or the temperature of the components included in the solar panel 800. Condition detection devices, such as temperature sensors 840, may detect the temperature levels of the solar panel 800 as well as components included in the solar panel 800. The temperature sensors may provide condition data that provides information as to the temperature of the solar panel 800 and/or the temperature of the components included in the solar panel 800 to the personality engine 820.

For example, four temperature sensors may be positioned on the motherboard included in the solar panel 800 and four temperature sensors may be positioned on the battery board included in the solar panel 800. The motherboard and the battery board are electronics included in the solar panel 800 that may potentially generate a significant amount of heat and if the heat generated by the motherboard and the battery board exceed a threshold, damage may occur to the motherboard and/or the battery board as well as to other portions of the solar panel 800. For example, the temperature sensors may be positioned on the transformer, the inverter, and/or the DC to AC converter due to the likelihood of these components to have an increased temperature that exceeds a threshold where damage may occur. The quantity of temperature sensors may be any quantity as well as the positioning of the temperature sensors may be positioned anywhere in the solar panel 800 such that adequate condition data with regard to whether the temperature of the solar panel 800 is exceeding a threshold increasing the likelihood of damage to the solar panel 800 that will be apparent to those skilled in the relevant art(s) without departing from the spirit and scope of the disclosure.

The temperature sensors 840 may monitor a temperature signal 875 as triggered by the temperature of different portions of the solar panel 800 based on the location of the temperature sensors 840. The temperature sensors 840 may then generate the temperature data signal 815 that contains condition data that indicates the temperature levels detected by the temperature sensors 840 to the personality engine 820.

The personality engine 820 may analyze the condition data provided in the temperature data signal 815 to determine the appropriate behavioral action that is to be executed in response to the temperature levels of different portions included in the solar panel 800. For example, the personality engine 820 may monitor the temperature data signal 815 to determine whether the temperature data signal 815 exceeds a threshold. The threshold may be a temperature level that when exceeded is a strong indication that components included in the solar panel 800 have become significantly hot and there is an increased risk of damage to the components and/or the solar panel 800. The personality engine 820 may make the user aware that the solar panel 800 has reached a temperature level with increased risk of damage to the solar panel 800 and/or the components included in the solar panel 800 by executing an audio recording that provides this information to the user.

In order to provide variation to the audio recording executed by the personality engine 820 when the temperature sensors 840 detects temperature levels that exceed the threshold, the personality engine 820 may categorize the temperature levels detected by temperature sensors 840 that exceed the threshold as being in a temperature operational event category. The personality engine 820 may then generate the behavioral action signal 880 in which the personality engine 820 queries the behavioral action database 810. The personality engine 820 may generate the behavioral action signal 880 to query the temperature operational event category to randomly select an audio recording that informs the user that solar panel 800 reached a temperature and that the solar panel 800 needs to cool down. In a first instance, the personality engine 820 may randomly select the audio recording "I am getting hot" to instruct the user that the solar panel 800 has exceeded a temperature level with increased risk of damage to the solar panel 800 and that the solar panel 800 needs to cool off. In a second instance, the personality engine 820 may randomly select the audio recording "I am getting hot and I need to cool down."

In an embodiment, the personality engine 820 may select and execute behavioral actions associated with the humidity level of the solar panel 800. Condition detection devices, such as the humidity sensor 830, may detect the humidity level of the solar panel 800. The humidity sensor 830 may provide condition data that provides information as to the humidity level of the solar panel 800 to the personality engine 820.

For example, the humidity sensor 830 may be positioned on the top edge of the circuit board that is within proximity of the top vent of the solar panel 800. The humidity sensor 830 is positioned in this location due to the likelihood of condensation accumulating inside the solar panel 800 due to the condensation seeping through the top vent of the solar panel 800. The quantity of humidity sensors 830 may be any quantity as well as the positioning of the humidity sensors 830 may be positioned anywhere in the solar panel 800 such that adequate condition data with regard to whether the condensation of the solar panel 800 is exceeding a threshold increasing the likelihood of damage to the solar panel 800 that will be apparent to those skilled in the relevant art(s) without departing from the spirit and scope of the disclosure.

The humidity sensor 830 may monitor the humidity signal 885 as triggered by the amount of condensation that accumulates within the solar panel 800. As the humidity level as provided by the humidity signal 885 increases, the amount of condensation that accumulates within the solar panel 800 also increases. The humidity sensor 830 may then generate the humidity data signal 805 that contains data that indicates the humidity level of the solar panel 800 as detected by the humidity sensor 830 and provide the humidity data signal 805 to the personality engine 820.

The personality engine 820 may analyze the condition data provided in the humidity data signal 805 to determine the appropriate behavioral action that is to be executed in response to the humidity level of the solar panel 800. For example, the personality engine 820 may monitor the humidity data signal 805 to determine whether the temperature data signal 805 exceeds a threshold. The threshold may be a humidity level, such as 95%, that when exceeded is a strong indication that a significant amount of condensation has accumulated in the solar panel 800 and full operation of the solar panel 800 with such a significant amount of condensation may cause damage to the solar panel 800 and/or the components included in the solar panel 800. The personality engine 820 may deactivate components included in the solar panel 800 that have increased risk of causing damage to themselves and/or the solar panel 800 when operating at a humidity level that exceeds the threshold. The personality engine 820 may maintain the remaining components that do not have an increased risk of causing damage to themselves or the solar panel 800 when operating at a humidity level exceeds the threshold such that the solar panel 800 may still provide some level of functionality to the user.

For example, the personality engine 820 may deactivate the high-voltage components included in the solar panel 800, such as the AC inverter, when the humidity data signal 805 indicates a humidity level of the solar panel 800 that exceeds the threshold, such as 95%. The personality engine 820 deactivates the high-voltage components due to the increased likelihood that the high-voltage components may cause damage to themselves and/or the solar panel 800 when operating with a humidity level that exceeds the threshold. After the humidity data signal 805 indicates a humidity level that exceeds the threshold, the personality engine 820 may reactivate the high-voltage components due to the decreased likelihood that the high-voltage components may cause damage to themselves and/or the solar panel 800 when operating with a humidity level that is below the threshold.

The personality engine 820 may then maintain the remaining low-voltage components, such as the devices that are powered via the Universal Serial Bus (USB) outlets 750(*a-n*), where n is an integer equal to or greater than one, the flashlight feature, the wireless communication and/or any other low-voltage component and/or feature. The personality engine 820 allows the low-voltage components and/or features to remain activated when the humidity level exceeds the threshold due to the low likelihood of the low-voltage components and/or features of causing damage to themselves and/or the solar panel 800 when operating with a humidity level that exceeds the threshold. In doing so, the personality engine 820 prevents damage from occurring to the solar panel 800 by deactivating the high-voltage components while still providing some functionality to the user by having the low-voltage components and/or features remain activated.

Often times, condensation may build inside the solar panel 800 without the user knowing of such condensation build-up such as in a situation where the user is operating the solar panel 800 outdoors where there is a high humidity level despite a lack of rain in the environment. Rather than simply have the personality engine 820 deactivate the high-voltage components without providing any information to the user as to the increased condensation level inside the solar panel 800, the personality engine 820 may execute an audio recording that instructs the user that the humidity level of solar panel 800 has exceeded the threshold.

In order to provide variation to the audio recording executed by the personality engine 820 when the humidity level of the solar panel 800 exceeds the threshold, the personality engine 820 may categorize the humidity level of the solar panel 800 exceeding the threshold as being in a condensation operational event category. The personality engine 820 may then generate a behavioral action signal 880 in which the personality engine 820 queries the behavioral action database 810. The personality engine 820 may generate the behavioral action signal 880 to query the condensation operational event category to randomly select an audio recording that instructs the user that the humidity level of the solar panel 800 has exceeded the threshold. In a first instance, the personality engine 820 may randomly select the audio recording "I am wet. I need to shut down" to instruct the user that the humidity level of the solar panel 800 has exceeded the threshold and that the solar panel 800 is going to deactivate the high-voltage components until the humidity level lowers below the threshold. In a second instance, the personality engine 820 may randomly select the audio recording "I detect the presence of water. I need to shut down."

In an embodiment, the personality engine 820 may select and execute behavioral actions associated with an unauthorized individual attempting to steal the solar panel 800 when the anti-theft feature is activated for the solar panel 800. Condition detection devices such as the accelerometer 850, may detect the physical impact absorbed by the solar panel 800 as the unauthorized individual attempts to pick up and steal the solar panel 800. Other condition detection devices, such as the digital compass 860, may detect that the position of the solar panel 800 has exceeded a threshold in which an authorized user would simply re-position the solar panel 800 and thus likely indicates that an unauthorized individual has attempted to steal the solar panel 800. The digital compass 860 may be a three-dimensional compass and/or any other type of compass that will be apparent to those skilled in the relevant art(s) without departing from the spirit and scope of the disclosure.

The user may activate the solar panel 800 to operate in anti-theft mode. In doing so, the accelerometer 850 may monitor the physical impact signal 865 as triggered by the physical impact absorbed by the solar panel 800. The level of physical impact absorbed by the solar panel 800 differs between the authorized user who gently touches the solar panel 800 to re-position the solar panel 800 as compared to the unauthorized individual who quickly grabs the solar panel 800 to steal the solar panel 800. The accelerometer 850 may then generate the physical impact data signal 825 that contains data that indicates whether the level of physical impact absorbed by the solar panel 800 exceeds the threshold as set when in anti-theft mode and provides the physical impact signal 865 to the personality engine 820.

The digital compass 860 may also monitor the position signal 895 as triggered by the position and/or orientation of solar panel 800. The positioning and/or orientation of the solar panel 800 differs between the authorized user who moderately re-positions the solar panel 800 as compared to unauthorized individual who transports the solar panel 800 well beyond the current position of the solar panel 800 to steal the solar panel 800. The digital compass 860 may then generate the position data signal 835 that contains data that indicates whether the positioning of the solar panel 800 exceeds the threshold as set when in anti-theft mode and provides the position data signal 835 to the personality engine 820.

The personality engine 820 may analyze the condition data provided by the physical impact signal 865 and position data signal 835 to determine the appropriate behavioral action that is to be executed in response to the physical impact absorbed by the solar panel 800 as well as the re-positioning of the solar panel 800. For example, the personality engine 820 may monitor the physical impact data signal 825 to determine whether the physical impact absorbed by the solar panel 800 exceeds the threshold as set when the solar panel 800 operates in the anti-theft mode. In such an example, the physical impact absorbed by the solar panel 800 may be significantly increased as the unauthorized user grabs the solar panel 800 in attempt to steal the solar panel as compared to the physical impact absorbed by the solar panel 800 when the authorized user attempts to gently re-position the solar panel 800 such that the solar panel 800 absorbs solar energy more efficiently. The personality engine may also monitor the position data signal 835 to determine whether the repositioning of the solar panel 800 has exceeded the threshold as the solar panel 800 operates in anti-theft mode.

In an embodiment, the personality engine 820 may activate an alarm as well as executing audio recordings that are played at high volume levels to bring attention to the unauthorized individual who is attempting to steal the solar panel 800 when the physical impact data signal 825 and/or the position data signal 835 exceed the thresholds as set when the solar panel 800 operates in anti-theft mode. After the personality engine 820 has activated the alarm and/or has initiated execution of the audio recordings, the alarm and/or audio recordings continue to play at high volume levels until there is the power has been drained by the battery bank 320.

The personality engine 820 may also lock the solar panel 800 such that the unauthorized individual attempting to steal the solar panel 800 is unable to operate any of the features associated with the solar panel 800. The only features activated by the personality engine 820 is the playing of the alarm and/or audio recordings at high volume levels in which the unauthorized individual is unable to deactivate the alarm and/or audio recordings. The deactivation of each of the features associated with the solar panel 800 enables the personality engine 820 to devote the power stored in the battery bank 320 to the playing of the alarm and/or audio recordings such that the playing of the alarm and/or audio recordings may be extended until the power stored in the battery bank 320 is drained.

In an embodiment, personality engine 820 may activate the alarm as well as execute the audio recordings played at high volume levels for a fixed amount of time when the physical impact data signal 825 and/or the position data signal 835 exceed the thresholds set when the solar panel 800 operates in anti-theft mode. After the fixed amount of time has expired, the personality engine 820 may then deactivate the alarm and/or audio recordings and execute an audio recording that instructs the unauthorized individual to pair the solar panel 800 to the unauthorized individual's smart phone.

The personality engine 820 may then execute an audio recording that instructs the unauthorized individual to activate location services on the unauthorized individual's smart phone. The personality engine 820 may then be able to obtain a Global Positioning System (GPS) location of the solar panel 800 based on the GPS signal generated by the unauthorized individual's smart phone after the unauthorized individual activates the location services of the individual's smart phone. The personality engine 820 may also be able to obtain the name of the unauthorized individual's smart phone as well as the personal information of the unauthorized individual when the unauthorized individual pairs the unauthorized individual's smart phone with the solar panel 800.

In an embodiment, the personality engine 820 may select and execute behavioral actions associated with the light intensity of the LEDs 740(*a-n*). Condition detection devices, such as the light meter 870, may detect the ambient light level surrounding the solar panel 800. The light meter 870 may provide condition data that provides information as to the ambient light level that surrounds the solar panel 800 to the personality engine 820.

Light meter 870 may monitor the ambient light signal 801 as triggered by the intensity of ambient light that surrounds the solar panel 800. The light meter 870 may then generate the ambient light level signal 845 that contains data that indicates the intensity of the ambient light surrounding the solar panel 800 as detected by the light meter 870 and provide the ambient light level signal 801 to the personality engine 820.

The personality engine 820 may analyze the condition data provided in the ambient light level signal 801 to determine the appropriate behavioral action that is to be executed in response to the intensity of ambient light surrounding the solar panel 800. For example, the personality engine 820 may monitor the ambient light level signal 801 to determine whether the personality engine 820 should adjust the intensity of the LEDs 740(*a-n*). As the ambient light level signal 801 provides an intensity of ambient light that is decreasing, the personality engine 820 may determine that the intensity of the LEDs 740(*a-n*) should be increased to account for the decrease in the intensity of ambient light surrounding the personality engine 820. As the ambient light level signal 801 provides an intensity of ambient light that is increasing, the personality engine 820 may determine that the intensity of LEDs 740(*a-n*) should be decreased to conserve power that is consumed by the LEDs 740(*a-n*) due to the increased intensity of ambient light surrounding the solar panel 800.

In an embodiment, the personality engine 820 may select and execute behavioral actions associated with the operating when a blackout has been detected. Condition devices, such as the power signal sensor 550 discussed in detail above in FIG. 5, may detect when the electric utility grid has entered a blackout and/or brownout and is no longer capable of providing sufficient AC power to satisfy the user's power requirements. The power signal sensor 550 may provide condition data that provides information as to whether the electric utility grid is no longer capable of providing sufficient AC power to satisfy the user's power requirements to the personality engine 802.

The power signal sensor 550 may monitor the electric utility grid AC power signal 803 as discussed in detail above in FIG. 5. The power signal sensor 550 may then generate the electric utility grid AC power level signal 802 that contains data that indicates level of AC power that the electric utility grid is capable of providing to the user and provide the electric utility grid AC power level signal 802 to the personality engine 820.

The personality engine 820 may analyze the condition data provided in the electric utility grid AC power level signal 802 to determine the appropriate behavioral action that is to be executed in response the AC power that is provided by the electric utility grid. For example, the personality engine 820 may monitor the electric utility grid AC power level signal 802 exceeds a threshold. The threshold may be a level of AC power that is provided by the electric utility grid that when the AC power provided by the electric utility grid dips below the threshold, the electric utility grid may no longer be able to provide sufficient AC power to satisfy the user's power requirements and may be indicative that the electric utility grid is suffering from a blackout and/or brownout.

The personality engine 820 may then activate the flashlight such that the LEDs 740(*a-n*) emit light at the highest intensity level for the LEDs 740(*a-n*) to assist the user if the user were to experience a blackout and/or brownout suffered by the electric utility grid. Often times, there may be a period of time after the user has lost power due to a blackout and/or brownout suffered by the electric utility grid that the user is surprised at the sudden loss of power and may not know why the power had been cut. Rather than simply have the personality engine 820 activate the flashlight in which the LEDs 740(*a-n*) are activated, the personality engine 820 may execute an audio recording that instructs the user that a blackout and/or brownout of the electric utility grid has been detected.

In order to provide variation to the audio recording executed by the personality engine 820 when the AC power provided by the electric utility grid dips below the threshold, the personality engine 820 may categorize the AC power level provided by the electric utility grid as dipping below the threshold as being in a blackout operational event category. The personality engine 820 may then generate a behavioral action signal 880 in which the personality engine 820 queries the behavioral action database 810. The personality engine 820 may generate the behavioral action signal 880 to query the blackout operational event category to randomly select an audio recording that instructs the user that the AC power provided by the electric utility grid has dipped below the threshold and is suffering a blackout and/or brownout. In a first instance, the personality engine 820 may randomly select the audio recording "I have detected a power outage" to instruct the user that the electric utility grid has suffered a blackout and/or brownout. In a second instance, the personality engine 820 may randomly select the audio recording "I have detected a power outage. But do not worry. I am here to help."

Figure 9:
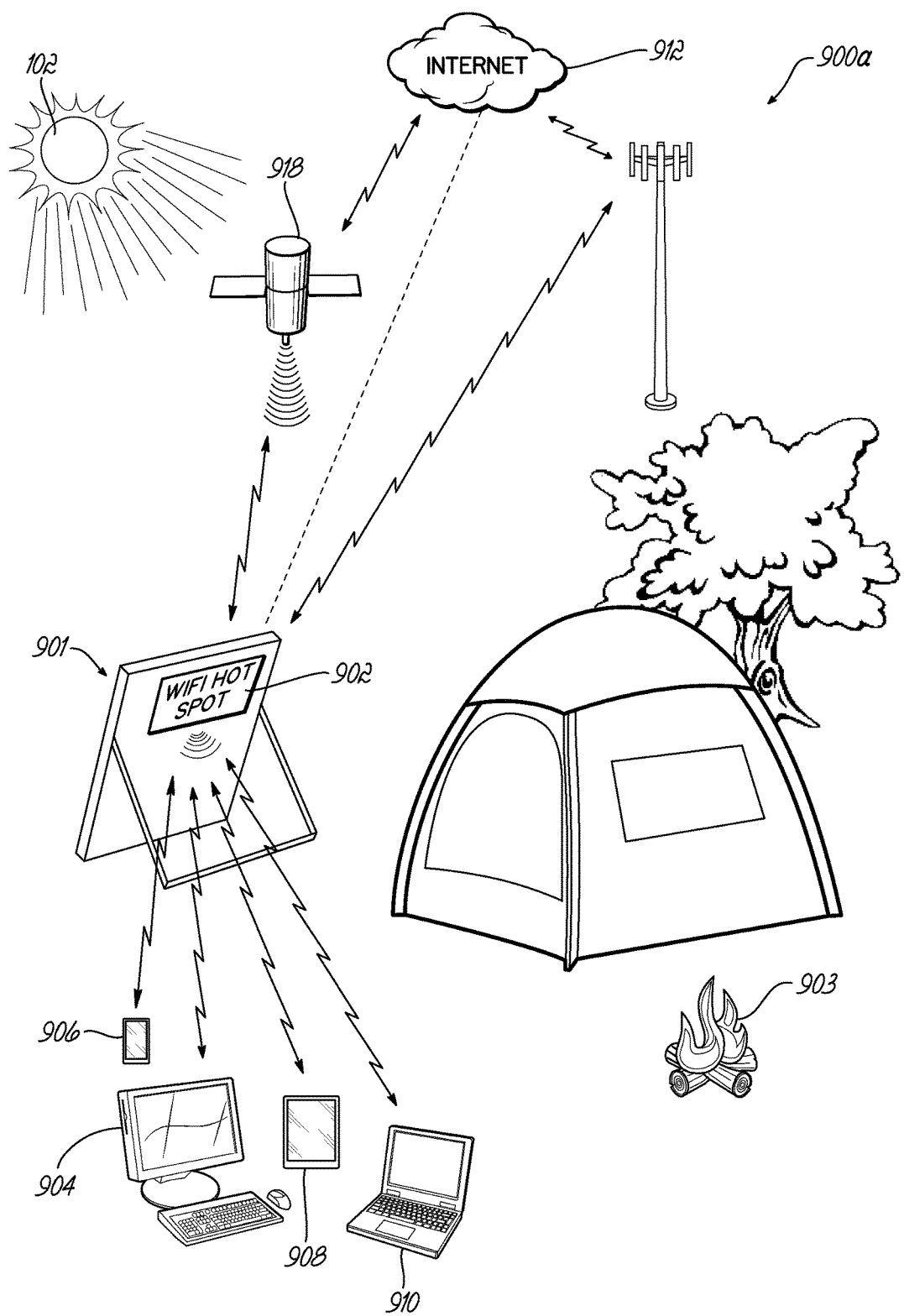
FIG. 9 illustrates an embodiment of a solar panel configuration of the present disclosure.

FIG. 9 shows an alternative embodiment of a solar panel configuration 900*a* of the present invention. As shown in this embodiment, a mobile solar panel 901 is illustrated as acting as a source of electrical generation from a solar source 102 while at the same time providing an internal Wi-Fi hotspot 902 for use in providing an access to the Internet 912 to various computing devices such as a smart phone 906, a desktop computer 904, a tablet 908, or a laptop computer 910 and/or any other type of computing device that will be apparent to those skilled in the relevant art(s) without departing from the spirit and scope of the disclosure.

The mobile solar panel 901, as illustrated in this figure, may have unique applicability in a deployed, camping, or other remote location that may not have access to a structure or other infrastructure such as might be available in a traditional domestic or other commercial applications. The solar panel 901 may be positioned, tilted, or otherwise oriented and/or moved throughout the day to achieve the best results from the available solar energy 102. This may be executed through use of automated tilt or adjustment mechanisms, or may be manually positioned by a user.

The solar panel 901 that is equipped with internal GPS or other position locating circuitry, as well as access to the Internet 912 via satellite phone or cellular connection, may use this data to optimize its position and time for collecting solar energy. A remote location with solar panel 901 may further be powered through the light and/or radiation that may admit from a campfire 903. Thus, the solar panel 901 is not necessarily confined to generating electricity for use in powering various devices in a remote location and/or providing power to its own internal communication circuitry to only times when the sun 102 may be shining.

Figure 10:
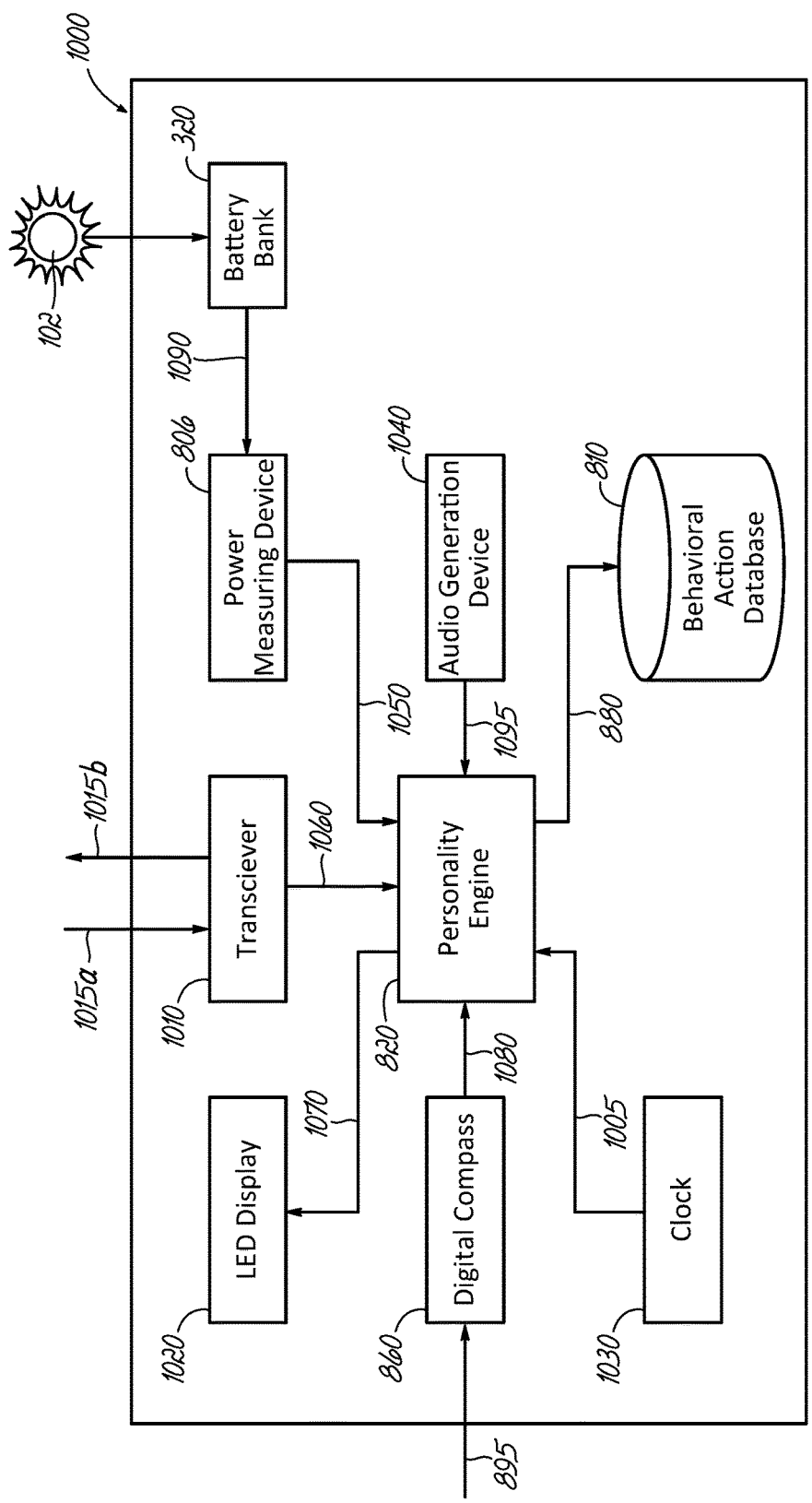
FIG. 10 is a schematic diagram of another exemplary solar panel that may incorporate the personality engine to interact with the user as the user engages the solar panel according to an exemplary embodiment of the present disclosure.

FIG. 10 is a schematic diagram of another exemplary solar panel 1000 that may incorporate the personality engine 820 to interact with the user as the user engages the solar panel 1000 according to an exemplary embodiment of the present disclosure. Although, FIG. 10 depicts a schematic diagram solar panel 1000, one of ordinary skill art will recognize that FIG. 10 may also depict a block diagram of the solar panels 100(*a-n*) in FIG. 1 and FIG. 2, solar panel 300 in FIG. 3, solar panel 400 in FIG. 4, solar panels 530*a* and 530*b* in FIG. 4B, solar panels 510(*a-n*) in FIG. 5, solar panel 630 in FIG. 6, the solar panel 710 in FIG. 7A and FIG. 7B, the solar panel 800 in FIG. 8, and the solar panel 902 in FIG. 9.

The personality engine 820 may operate as the central controller of the solar panel 1000 in that the personality engine 820 may orchestrate how the solar panel 1000 may be positioned by the user to optimize capturing of the solar energy 102 by the solar panel 1000. The personality engine 820 may analyze condition data that is generated by the different conditions that are detected condition detection devices that are associated with optimizing the capturing of the solar energy 102 by the solar panel 1000. The personality engine 820 may then select different behavioral actions and initiate execution of the those behavioral actions to provide feedback to the user such that the user may position the solar panel 1000 to optimize the capturing of the solar energy 102.

The solar panel 1000 shares many similar features with the solar panels 100(*a-n*), the solar panel 300, the solar panel 400, the solar panels 530*a* and 530*b*, the solar panels 510(*a-n*), the solar panel 630, the solar panel 710, the solar panel 800, and the solar panel 902; therefore, only the differences between the solar panel 1000 and the solar panels 100(*a-n*), the solar panel 300, the solar panel 400, the solar panels 530*a* and 530*b*, the solar panels 510(*a-n*), the solar panel 630, the solar panel 710, the solar panel 800, and the solar panel 902 are to be discussed in further detail. The features depicted in the schematic diagram of the solar panel 800 may also be included in the solar panel 1000 but have been omitted for simplicity.

In an embodiment, the personality engine 820 may select and execute behavioral actions associated with an individual and/or object that have moved into position between the sun and the solar panel 1000 and thus disrupting the charging of the battery bank 320 with the capturing of the solar energy 102 generated by the sun. Condition devices, such as the power measuring device 806, may detect when the charging of the battery bank 320 from the solar energy 102 generated by the sun has been interrupted. The power measuring device 806 may provide condition data that provides information as to whether the charging of the battery bank 320 from the solar energy 102 generated by the sun has been interrupted.

The power measuring device 806 may monitor the solar charging signal 1090 that provides condition data as to the charging of the battery bank 320 by the solar energy 102 as discussed in detail above in FIG. 3. The power measuring device 806 may then generate the solar charging signal 1050 that contains data that indicates whether the charging of the battery bank 320 by the solar energy 102 has been disrupted to the personality engine 820. For example, the solar charging signal 1090 may provide condition data that is associated with the wattage that the battery bank 320 is charging based on capturing the solar energy 102 from the sun. In another example, the solar charging signal 1090 may provide condition data that is associated with the voltage associated with the power that the battery bank 320 is charging based on capturing the solar energy 102 from the sun. In another example, the solar charging signal may provide condition data that is associated with the current associated with the power that the battery bank 320 is charging based on capturing the solar energy 102 from the sun.

The personality engine 820 may analyze the condition data provided by the solar charging signal 1050 as well as the condition data provided by the charging time signal 1005 as provided by the clock 1030 to determine the appropriate behavioral action that is to be executed in response to the charging of the battery bank 320 by the solar energy 102. For example, the solar panel 1000 may be positioned by the user such that the solar panel 1000 is capturing a significant amount of solar energy 102 generated by the sun. The battery bank 320 may then charge based on the solar energy 102 that is being captured by the solar panel 1000. As the battery bank 320 charges due to the solar energy 102 that is captured by the solar panel 1000, the solar charging signal 1050 may provide an increased level of watts that the battery bank 320 is charging as the solar panel 1000 captures the solar energy 102. The charging time signal 1005 may also provide the time in which the battery bank 320 began charging from the solar energy 102 and may continuously provide updated time periods as to the period of time in which the battery bank 320 continues to charge from the solar energy 102.

However, an obstruction positioned between the solar panel 1000 and the sun that blocks the solar energy 102 that is captured by the solar panel 1000 may trigger an immediate and significant decrease in the watts that the battery bank 320 is charging due to the solar panel 1000 no longer capturing the solar energy 102. For example, an individual that stands between the solar panel 1000 and the sun that blocks the solar energy 102 that is captured by the solar panel 1000 causes an immediate and significant decrease in the watts that the battery bank 320 is charging due to the battery bank 320 no longer receiving solar energy 102 from the sun.

As the personality engine 820 monitors the solar charging signal 1050, the personality engine 820 may detect an immediate and significant drop in the watts provided by the solar charging signal 1050 due to the interruption of the charging of the battery bank 320 resulting from the sudden cut-off in capturing solar energy 102 by the solar panel 1000. The personality engine 820 may also detect from the charging time signal 1005 that the battery bank 320 had previously been charging with a significant level of watts for an extended period of time as the solar panel 1000 was capturing the solar energy 102 but then suddenly stopped charging.

Based on the immediate and significant drop in wattage provided by the solar charging signal 1050 and the sudden termination of charging by the battery bank 320 as provided by the charging time signal 1005, the personality engine 820 may determine that an obstruction has been positioned between the solar panel 1000 and the solar energy 102 provided by the sun thus resulting in the sudden termination in charging by the battery bank 320. The personality engine 820 may also determine that an obstruction has been positioned between the solar panel 1000 and the solar energy 102 based on an immediate and significant decrease in voltage and/or current in a similar manner as discussed above with regard to wattage.

The personality engine 820 may then generate an audio recording signal 1095 and instruct the audio recording device 1040 to play an audio recording that instructs the user to remove the obstruction that is positioned between the solar panel 1000 and the sun and is thus blocking the solar energy 102 that is captured by the solar panel 1000. In order to provide variation to the audio recording executed by the personality engine 820 when the wattage that the battery bank 320 is charging with immediately and significantly decreases, the personality engine 820 may categorize the immediate and significant drop in wattage as a solar energy obstruction operational event category.

The personality engine 820 may then generate a behavioral action signal 880 in which the personality engine 820 queries the behavioral action database 810. The personality engine 820 may generate the behavioral action signal 880 to query the solar energy obstruction operational event category to randomly select an audio recording that instructs the user to remove the obstruction blocking the solar panel 1000 from capturing the solar energy 102. In a first instance, the personality engine 820 may randomly select the audio recording "Do you mind? Get out of the way. You are blocking my sunlight" to instruct the user to remove the obstruction blocking the solar panel 1000 from capturing the solar energy 102. In a second instance, the personality engine 820 may randomly select the audio recording "Excuse me, you are blocking my sunlight."

In an embodiment, the personality engine 820 may select and execute behavioral actions associated with providing feedback to the user such that the user may position the solar panel 1000 in an optimal position to optimize the amount of solar energy 102 that is captured by the solar panel 1000 to maximize the charge of the battery bank 320 from the solar energy 102. Condition devices, such as the digital compass 860, may detect the position of the solar panel 1000 relative to the sun as well as determining the optimal position for the solar panel 1000 to maximize the charge of the battery bank 320 based on the position of the solar panel 1000, the time of day, as well as the position of the sun. The digital compass 860 may provide condition data that provides information as to the position of the solar panel 1000 as well as the optimal position for the solar panel 1000 to capture the solar energy 102.

The digital compass 860 may monitor the position signal 895 that provides condition data as to the current position of the solar panel 1000 as well as the optimal position of the solar panel 1000 to optimize the amount of solar energy 102 captured by the solar panel 1000 based on the position of the solar panel 1000, the time of day, and/or the position of the sun. The digital compass may then generate optimal position data signal 1080 that contains condition data as to whether a difference between the current position of the solar panel 1000 and the optimal position of the solar panel 1000 to optimize the amount of solar energy 102 that is captured exists.

The personality engine 820 may analyze the condition data provided by the optimal position data signal 1080, the condition data provided by the charging time signal 1005 as provided by the clock 1030 as well as the solar charging signal 1050 to provide feedback to the user as to the current position of the solar panel 1000 relative to the optimal position of the solar panel 1000 to optimize the amount of solar energy 102 that is captured. For example, the personality engine 820 may recognize that the solar panel 1000 is positioned outdoors based on an increased wattage level provided by the solar charging signal 1050. The solar panel 1000 being positioned outdoors increases the amount of solar energy 102 that is captured by the solar panel 1000 and thus results in an increased amount of wattage provided by the charge of the battery bank 320 as compared to when the solar panel 1000 is positioned indoors.

The personality engine 820 may also recognize the current position of the solar panel 1000 based on optimal position data signal 1080 provided by the digital compass 1000 as well as the time of day based on the charging time signal 1005 provided by the clock 1030. In such an example, the personality engine 820 may recognize that the solar panel 1000 is positioned outside as well as positioned in the northern hemisphere in the morning. Based on this information, the personality engine 820 may instruct the audio generation device 1040 to play an audio recording that instructs the user to position the solar panel 1000 to face south to optimize the amount of solar energy 102 captured by the solar panel 1000 being positioned in the northern hemisphere during the morning.

As the user initiates repositioning of the solar panel 1000 due to the feedback provided by the personality engine 820, the digital compass 860 may continue to provide updated information as to the current position of the solar panel 1000 and the optimal position of the solar panel 1000 to optimize the amount of solar energy 102 captured by the solar panel 1000. For example, the digital compass 860 may continue to generate the optimal position data signal 1080 as the user repositions the solar panel 1000 in order to provide updated information to the personality engine 820 with regard to the current position of the solar panel 1000 and the optimal position of the solar panel 1000 to optimize the amount of solar energy 102 captured by the solar panel 1000.

The personality engine 820 may then determine the difference between the current position of the solar panel 1000 and the optimal position of the solar panel 1000 to optimize the amount of solar energy 102 captured by the solar panel 1000 and may provide feedback to the user based on the difference. For example, as the user repositions the solar panel 1000, the digital compass 860 may continue to generate the optimal position data signal 1080 that informs the personality engine 820 that the current position of the solar panel 1000 is moving closer to the optimal position of the solar panel 1000 to optimize the amount of solar energy 102 captured by the solar panel 1000. The personality engine 820 may recognize that the difference between the current position of the solar panel 1000 and the optimal position of the solar panel 1000 is decreasing.

The solar panel 1000 may then provide feedback to the user in generating the audio recording signal 1095 to instruct the audio generation device 1040 to play the audio recording of "you are getting warmer" as the user is positioning the solar panel 1000 closer to the optimal position. The solar panel 1000 may then generate the audio recording signal 1095 to instruct the audio generation device 1040 to play the audio recording of "You hit the spot!" when user has positioned the solar panel 1000 in the optimal position to optimize the solar energy captured by the solar panel 1000 as provided by the optimal position data signal 1080 generated by the digital compass 860.

The personality engine 820 may continue to provide feedback to the user as the conditions in which the solar panel 1000 is capturing solar energy 102 change such that the user may continue to reposition the solar panel 1000 in order to optimize the solar energy 102 captured by the solar panel 1000. The personality engine may continue to monitor the charging time signal 1005 to determine the time of day. As the time of day progresses, the sun moves relative to the earth and thus the optimal position of the solar panel 1000 may also move when the solar panel 1000 is no longer in the optimal position due to the sun moving relative to the solar panel 1000.

The personality engine 820 may also continue to monitor the solar charging signal 1050 in order to optimize the solar energy 102 captured by the solar panel 1000. After the solar panel 1000 is positioned in the optimal position to capture the optimal amount of solar energy 102, the wattage of the charge of the battery bank 320 as provided by the solar charging signal 1050 increases as the solar panel 1000 is capturing an optimal amount of solar energy that charges the battery bank 320. As the solar charging signal 1050 decreases over time, the positioning of the solar panel 1000 relative to the sun may no longer be in an optimal position due to the moving of the sun relative to the solar panel 1000.

The personality engine 820 may also recall that the solar charging signal 1050 increased to the optimal wattage as the battery bank 320 charged at when the solar panel 1000 was positioned at a specific position at a specific time each day. The personality engine 820 may then recognize that for each specific time each day, the solar panel 1000 is to be positioned to the corresponding position that in the past had provided an increase to the optimal wattage as the battery bank charged. Based on the above monitoring, the personality engine 820 may continue to provide feedback to the user as to the optimal position of the solar panel 1000 to capture the optimal amount of solar energy 102.

In addition to providing audio feedback to the user with regard to the current position of the solar panel 1000 relative to the optimal position of the solar panel 1000 to capture the optimal amount of solar energy 102, the personality engine 820 may also provide visual feedback to the user. As the user attempts to reposition the solar panel 1000, the digital compass may generate the position data signal 1080 that notifies the personality engine 820 that the user is attempting to reposition the solar panel 1000. The personality engine 820 may then generate the LED signal 1070 that transitions the LED display that includes LEDs 740(*a-n*) from activating in a manner that corresponds to the current battery level of the battery bank 320 to activating in a manner that corresponds to the difference between the current position of the solar panel 1000 and the optimal position as well as activating the LEDs 740(*a-n*) to represent the digital compass 860.

As the user attempts to reposition the solar panel 1000, the personality engine 820 instructs the LED display to activate the LEDs 740(*a-n*) to flash in a first color that represents the digital compass 860. As the user repositions the solar panel 1000, the digital compass 860 generates the position data signal 1080 that provides the current position of the solar panel 1000 and the optimal position of the solar panel 1000.

As the user repositions the solar panel 1000 such that the difference between the current position of the solar panel 1000 and the optimal position of the solar panel 1000 decreases, the personality engine 820 may adjust the rate of the flashing LEDs 740(*a-n*) to correspond to the user repositioning the solar panel 1000 to a current position that continues to become closer to the optimal position.

For example, the personality engine 820 may increase the rate of the flashing LEDs 740(*a-n*) as the user repositions the solar panel 1000 such that the current position of the solar panel 1000 moves closer and closer to the optimal position. Once the user has positioned the solar panel 1000 such that the solar panel 1000 is in the optimal position, the personality engine 820 may terminate the flashing of the LEDs 740(*a-n*) and have the LEDs 740(*a-n*) emit light in a solid state without flashing indicating to the user that the solar panel 1000 is now positioned in the optimal position. In another example, the personality engine 820 may change the color of the LEDs 740(*a-n*) when the solar panel is positioned in the optimal position.

The personality engine 820 may also provide visual feedback to the user as to the current position of the solar panel 1000 relative to the optimal position based on the wattage of the charge of the battery bank 320 as based on the amount of solar energy 102 captured by the battery bank 320. As the user attempts to reposition the solar panel 1000, the power measuring device 806 may generate the solar charging signal 1050 that notifies the personality engine 820 that the amount of wattage associated with the charge of the battery bank 320 is changing. The personality engine 820 may identify such a change in the wattage as being triggered by the user attempting to reposition the solar panel 1000 to move the solar panel 1000 into the optimal position in order maximize the amount of wattage of the charge of the battery bank 320. The personality engine 820 may then generate the LED signal 1070 to not only have the LEDs 740(*a-n*) flash as discussed above relative to the position of the solar panel 1000 relative to the optimal position, but to also activate in a manner that represents the wattage level associated with the charge of the battery bank 320.

As the user attempts to reposition the solar panel 1000, the personality engine 820 instructs the LED display 1020 to activate specific LEDs 740(*a-n*) that correspond to the current wattage level associated with the charge of the battery bank 320. For example, as the solar panel 1000 is positioned a significant distance from the optimal position, the current wattage level of the charge of the battery bank 320 may be low due to the solar panel 1000 capturing a lower amount of solar energy 102 with the solar panel 1000 positioned in a non-optimal position. The personality engine 820 may generate the LED signal 1070 to instruct just the LED 740*a* to activate representing a low wattage level of the charge of the battery bank 320.

As the user moves the solar panel 1000 closer to the optimal position, the current wattage level of the charge of the battery bank 320 increases due to the solar panel 1000 capturing an increased amount of solar energy 102 with the solar panel 1000 being positioned closer to the optimal position. The personality engine 820 may generate the LED signal 1070 to instruct LED 740*a* and then LED 740*b* and then LED 740*c* and then LED 740*d* and so on to activate as the user moves the solar panel 1000 closer to the optimal position representing an increase in the wattage level of the charge of the battery bank 320.

As the user moves the solar panel 1000 into the optimal position, the current wattage level of the charge of the battery bank 320 increases to an optimal level due to the solar panel 1000 capturing an optimal amount of solar energy 102 with the solar panel 1000 being positioned in the optimal position. The personality engine 820 may generate the LED signal 1070 to instruct each of the LEDs 740(*a-n*) to activate when the solar panel 1000 is positioned in the optimal position representing an increase in the wattage level of the charge of the battery bank 320 to the optimal wattage level. Thus, the user may tune the positioning of the solar panel 1000 based on the feedback generated by the personality engine 820 to optimize the amount of wattage that the battery bank 320 charges based on the optimal amount of solar energy 102 captured by the solar panel 1000.

In an embodiment, the personality engine 820 may receive information from the smart phone 906 and provide that information to the user via the solar panel 1000 as well as transmit the audio recordings generated by the audio generation device to the smart phone 906 such that smart phone 906 may also communicate the audio recordings to the user via the smart phone 906. The smart phone 906 may obtain information via the Internet 912 that the solar panel 1000 is unable to detect and/or obtain independently. The smart phone 906 may communicate this information via information signal 1015*a* that is received by the transceiver 1010. The transceiver 1010 may then provide the information communicated to transceiver 1010 from the smart phone 906 to the personality engine 820 via the information data signal 1060. The personality engine 820 may then determine the appropriate behavioral actions to execute in response to the received information from the smart phone 906.

For example, the smart phone 906 may detect warnings and/or alerts based on oncoming weather conditions. The solar panel 1000 may be unable to detect an oncoming weather pattern before the oncoming weather pattern has arrived. For example, the solar panel 1000 may detect a significant decrease in the solar energy 102 absorbed by the solar panel 1000 and even detect rain based on the increase in condensation. However, the solar panel 1000 may be unable to detect the severity of an oncoming storm in advance to provide the user sufficient warning to take the appropriate actions to avoid the storm. In such an example, the smart phone 906 may transmit weather updates, weather warnings and so on to the transceiver 1010. The personality engine 820 may then analyze the information provided with the weather warnings and execute the appropriate behavioral action such as instructing the audio generation device to play an audio recording that makes the user aware that a severe storm is approaching.

The personality engine 820 as well as transmit the audio recordings generated by the audio generation device to the smart phone 906 such that smart phone 906 may also communicate the audio recordings to the user via the smart phone 906. Often times, the user may change their position from where the solar panel 1000 is positioned to a position that is sufficient a distance from the solar panel 1000 that that user may not hear the audio recordings played by the audio generation device 1040.

Thus, the personality engine 820 may provide the content of the audio recordings via the information data signal 1060 to the transceiver 1010. The transceiver 1010 may then transmit the content of the audio recordings via the information signal 1015*b* to the smart phone 906. The smart phone 906 may then provide the audio recordings as played by the audio generation device 1040 to the user via text message, email, and/or audio recording to the user. In doing so, the user may be updated with audio recordings played by the audio generation device 1040 when no longer within earshot of the solar panel 1000.

Although the above discussion provides each of the features in respect to a solar panel, one of ordinary of skill in the art would recognize that the above features may also be included in other electronic devices that differ from the solar panel. For example, the other electronic devices that may incorporate the above features include but are not limited to, a mobile telephone, a portable computing device, other computing devices such as a personal, a laptop, or a desktop computer, a computer peripheral such as a printer, a portable audio and/or a video player, a payment system, a toy, a game, a poster, packaging, an advertising material, a product inventor checking system, and/or any other suitable electronic device that will be apparent to those skilled in the relevant art(s) without departing from the spirit and the scope of the invention.

Examples of functionality performed by the controller 360, the controller 360*a*, the controller 360*b*, the personality engine 720, and the personality engine 820 are discussed in detail above. However as mentioned above, the above references are examples and are not limiting. The functionality of each of the controller 360, the controller 360*a*, the controller 360*b*, the personality engine 720, and the personality engine 820 may be performed individually by each of the controller 360, the controller 360*a*, the controller 360*b*, the personality engine 720, and the personality engine 820 and/or be shared among a combination of the controller 360, the controller 360*a*, the controller 360*b*, the personality engine 720, the personality engine 820 and/or any additional processing devices not explicitly referenced above. As referred to herein, the controller 360, the controller 360*a*, the controller 360*b*, the personality engine 720, and the personality engine 820, and/or any additional processing device incorporated into the solar panels referenced above may be any type of processing (or computing) device having one or more processors. Such a processing device may include software, firmware, hardware, or a combination thereof. Software may include one or more applications and an operating system. Hardware can include, but may not be limited to, a processor, memory, and/or graphical user display.

CONCLUSION

It is to be appreciated that the Detailed Description section, and not the Abstract section, is intended to be used to interpret the claims. The Abstract section may set forth one or more, but not all exemplary embodiments, of the present disclosure, and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made without departing from the spirit and scope of the present disclosure. Thus the present disclosure should not be limited by any of the above-described exemplary embodiments, but should be defined only in accordance with the following claims and their equivalents.

What is claimed is:

1. A solar panel, comprising:
a plurality of condition detection devices configured to:
detect a plurality of conditions that the solar panel is exposed to, wherein each condition is triggered by an operational event that the solar panel is encountering, and
generate condition data that provides information as to each of the conditions that the solar panel is exposed to and each operational event that triggered each of the conditions that the solar panel is encountering; and
a personality engine configured to:
analyze the condition data provided by each of the condition detection devices to determine a behavioral action from a plurality of behavioral actions that the solar panel is to execute in response to each operational event that the solar panel is encountering, and
execute the determined behavioral action so that each executed behavioral action is a response to each operational event that the solar panel is encountering,
wherein the personality engine is further configured to:
analyze the condition data provided by each of the condition detection devices to determine a type of operational event that generated each of the conditions detected by each of the condition detection devices; and
categorize each of the conditions into an operational event category selected from a plurality of operational event categories based on the type of operational event that triggered each of the conditions,
wherein the personality engine is further configured to associate each of the behavioral actions to at least one operational event category so that each behavioral action associated with each operational event category that is executed by the personality engine responds to the operational event that the solar panel is encountering,
wherein the personality engine is further configured to:
randomly select a behavioral action associated with an operational event category that a condition detected by at least one condition detection device is categorized within; and
execute the randomly selected behavioral action so that the solar panel responds to the operational event that the solar panel is encountering.

2. The solar panel of claim 1, wherein the personality engine is further configured to:
determine whether a condition detected by the at least one condition detection device satisfies a threshold that is associated with the condition;
randomly select a behavioral action associated with an operational event category that a condition detected by at least one condition detection device is categorized within when the condition satisfies the threshold associated with the condition; and
execute the randomly selected behavioral action so that the solar panel responds to the operational event that the solar panel is encountering when the condition satisfies the threshold associated with the condition.

3. A solar panel, comprising:
a plurality of condition detection devices configured to:
detect a plurality of solar energy conditions that the solar panel is exposed to as the solar panel is collecting energy from a light source, wherein each solar energy condition is triggered by an solar energy operational event that the solar panel is encountering as the solar panel is collecting energy from the light source, and
generate solar energy condition data that provides solar energy information as to each of the solar energy conditions that the solar panel is exposed to and each solar energy operational event that triggered each of the conditions that the solar panel is encountering as the solar panel is collecting energy from the light source; and a personality engine configured to:
analyze the solar energy condition data provided by each of the condition detection devices to determine a behavioral action from a plurality of behavioral actions that the solar panel is to execute in response to each solar energy operational event that the solar panel is encountering as the solar panel is collecting energy from the light source, and
execute the determined behavioral action so that each executed behavioral action is a response to each solar energy operational event that the solar panel is encountering as the solar panel is collecting energy from the light source
wherein the plurality of condition detection devices comprises:
a three-dimensional compass configured to:
detect a position of the solar panel relative to a position of the light source, and
generate condition data that is associated with the position of the solar panel relative to the position of the light source; and
a power meter configured to:
measure an amount of power stored by the solar panel as the solar panel collects energy from the light source, and
generate condition data that is associated with how the solar panel stores power as the solar panel collects energy from the light source.

4. The solar panel of claim 3, wherein the personality engine is further configured to:
randomly select a behavioral action associated with the positioning of the solar panel relative to the light source based on the solar energy condition detected by the three-dimensional compass as the solar panel collects energy from the light source; and
execute the randomly selected behavioral action associated with the positioning of the solar panel relative to the light source so that the solar panel responds to the solar energy operational event that the solar panel is encountering as the solar panel collects energy from the light source.

5. The solar panel of claim 3, wherein the personality engine is further configured to:
randomly select a behavioral action associated with the amount of power stored by the solar panel as the solar panel collects energy from the light source; and
execute the randomly selected behavioral action associated with the amount of power stored by the solar panel so that the solar panel responds to the solar energy operational event that the solar panel is encountering as the solar panel collects energy from the light source.

6. The solar panel of claim 4, wherein the personality engine is further configured to execute a selected behavioral action that provides feedback to a user that is attempting to position the solar panel in an optimal position relative to the light source so that a maximum amount of energy as generated by the light source is absorbed by the solar panel.

7. The solar panel of claim of claim 5, wherein the personality engine is further configured to execute a selected behavioral action that provides feedback to a user that exposure of the solar panel to the light source is compromised due to a decrease in the amount of power that the solar panel is storing as the solar panel collects energy from the light source.

* * * * *